US012740139B2

(12) United States Patent
Park et al.

(10) Patent No.: US 12,740,139 B2
(45) Date of Patent: Sep. 15, 2026

(54) THREE-DIMENSIONAL SEMICONDUCTOR DEVICE AND METHOD OF FABRICATING THE SAME

(71) Applicant: Samsung Electronics Co., Ltd., Suwon-si (KR)

(72) Inventors: Jisoo Park, Suwon-si (KR); Byungju Kang, Suwon-si (KR); Jaehyoung Lim, Suwon-si (KR); Kwanyoung Chun, Suwon-si (KR); Subin Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 373 days.

(21) Appl. No.: 18/435,305

(22) Filed: Feb. 7, 2024

(65) Prior Publication Data

US 2025/0072106 A1 Feb. 27, 2025

(30) Foreign Application Priority Data

Aug. 25, 2023 (KR) ........................ 10-2023-0111715

(51) Int. Cl.
*H10D 84/85* (2025.01)
*H10D 30/01* (2025.01)
(Continued)

(52) U.S. Cl.
CPC ......... *H10D 84/856* (2025.01); *H10D 30/014* (2025.01); *H10D 30/43* (2025.01);
(Continued)

(58) Field of Classification Search
CPC .... H10D 84/856; H10D 30/014; H10D 30/43; H10D 30/6729; H10D 30/6735;
(Continued)

(56) References Cited

U.S. PATENT DOCUMENTS 10,090,193 B1 10/2018 Chanemougame et al.
10,833,078 B2 11/2020 Smith et al.
(Continued)

FOREIGN PATENT DOCUMENTS

EP 4 407 669 A1 7/2024

*Primary Examiner* — Mohammad A Rahman
(74) *Attorney, Agent, or Firm* — HARNESS, DICKEY & PIERCE, P.L.C.

(57) ABSTRACT

A three-dimensional semiconductor device may include a back-side metal layer, a lower channel pattern on the back-side metal layer, first and second lower source/drain patterns, which are spaced apart from each other in a first direction with the lower channel pattern interposed therebetween, the first lower source/drain pattern being connected to the lower channel pattern, an upper channel pattern on the lower channel pattern, a first upper source/drain pattern on the first lower source/drain pattern, the first upper source/drain pattern being connected to the upper channel pattern, a second upper source/drain pattern on the second lower source/drain pattern, and a wide via electrically connecting the first upper source/drain pattern to the second lower source/drain pattern. The wide via may include first and second via portions having first and second top surfaces, and here, the second top surface may be located at a level lower than the first top surface.

20 Claims, 36 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10D 84/01*** | (2026.01) |
| ***H10D 84/03*** | (2025.01) |
| ***H10D 88/00*** | (2026.01) |
| ***H10W 20/41*** | (2026.01) |

(52) U.S. Cl.

CPC ..... *H10D 30/6729* (2025.01); *H10D 30/6735* (2025.01); *H10D 62/121* (2025.01); *H10D 64/017* (2025.01); *H10D 84/0167* (2025.01); *H10D 84/0186* (2025.01); *H10D 84/038* (2025.01); *H10D 88/01* (2025.01); *H10W 20/427* (2026.01)

(58) Field of Classification Search

CPC ............... H10D 62/121; H10D 64/017; H10D 84/0167; H10D 84/0186; H10D 84/038; H10D 88/01; H10D 64/251; H10D 84/0149; H10D 88/00; H10D 30/6757; H10D 64/254; H10D 84/853; H10W 20/427; H10W 20/481; H10W 20/435; H10W 20/0698; H10W 20/42

See application file for complete search history.

(56) References Cited

U.S. PATENT DOCUMENTS

| | | | | |
|---|---|---|---|---|
| 11,063,045 | B2 | 7/2021 | Wu et al. | |
| 11,201,148 | B2 | 12/2021 | Liebmann et al. | |
| 11,322,401 | B2 | 5/2022 | Smith et al. | |
| 11,362,090 | B2 | 6/2022 | Wu et al. | |
| 2010/0012997 | A1 * | 1/2010 | Jang ....................... | H10B 41/20 257/315 |
| 2021/0143159 | A1 | 5/2021 | Zhang et al. | |
| 2022/0068921 | A1 | 3/2022 | Chanemougame et al. | |
| 2022/0271033 | A1 | 8/2022 | Chanemougame et al. | |
| 2022/0320093 | A1 | 10/2022 | Peng et al. | |
| 2023/0069137 | A1 | 3/2023 | Tsai et al. | |
| 2023/0387007 | A1 | 11/2023 | Xie et al. | |
| 2024/0072115 | A1 | 2/2024 | You et al. | |

* cited by examiner

FIG. 5C

M1
UAR
LAR
BSM
D'
CTR
UV1
UAC3
USD3
LSD3
LAC3
LC3
SHC
CT
C1
C2
UAC2
USD2
LSD2
LAC2
LC2
SHC
UMI
140
130
CT(C1)
UAC
USD
120
WV(W2)
110
LSD
LAC
ST
LC
210
LVI
LMI
D
D2
D3
D1

M1
CTR
GE
GE
G1
SP4
SP3
UCH
SDL
UAR
DSP
SP2
SP1
LCH
LAR
LGC
BSM
E'
SHC
SHC
CT
C1
C2
UVI
UGC
UMI
140
130
GP
CT(C1)
GI
P06
P05
P04
P03
P02
P01
ST
210
WV(W2)
LMI
E
UGE
LGE
STP
D3
D2
D1

Figure 9A:
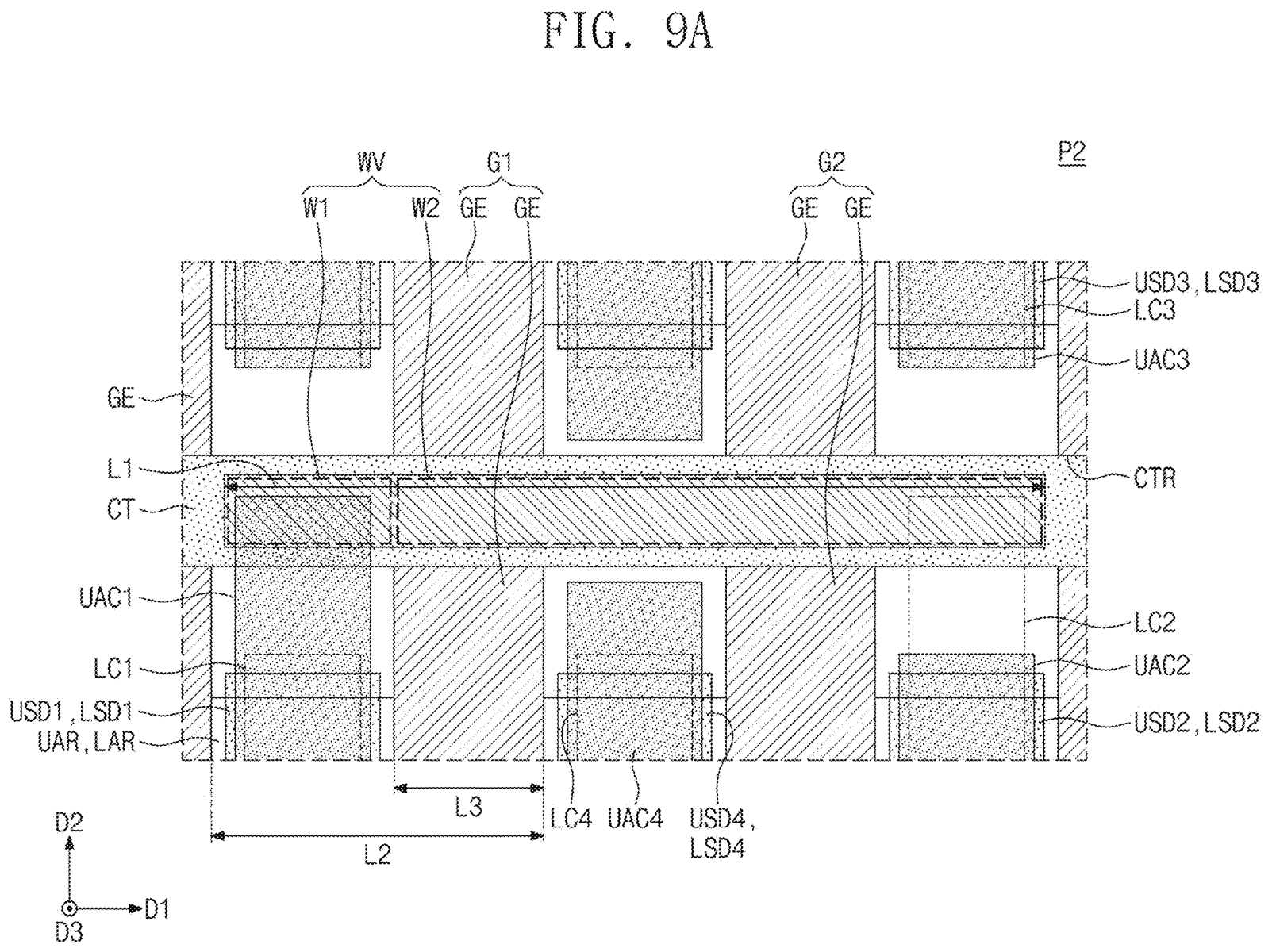

USD3, LSD3
LC3
UAC3
CTR
LC2
UAC2
USD2, LSD2
G2
GE
GE
USD4, LSD4
UAC4
LC4
G1
GE
GE
WV
W2
W1
L3
L2
GE
L1
CT
UAC1
LC1
USD1, LSD1
UAR, LAR
D1
D2
D3

E'
TR1
LIL1
E
MP
PP
ACL2
SAL2
ACL2
SAL2
SDL
SAL1
ACL1
SAL1
ACL1
SAL1
ST
105
STP2
DSL
STP1
STP
D2
D3
D1

C'
C
PLH
120
USD
110
LSD
ST
105
D2
D3
D1

CTR
GE
G1
GE
SP4
UCH
UAR
SP3
SDL
DSP
SP2
LCH
LAR
SP1
E'
TR1
LIL1
E
130
GP
CT(C1)
GI
PO6
PO5
PO4
UGE
PO3
PO2
PO1
LGE
STP
ST
105
D3
D2
D1

FIG. 14A

RS1
CT(C1)
WVp
105
B
B'
D1
D2
D3

FIG. 14B

CTR
RS1 WVp
C'
PLH
ST
C
130
CT(C1)
120
USD
110
LSD
105
D3
D2
D1

CTR
RS1 WVp
GE
G1
GE
SP4
UCH
SP3
UAR
SDL
DSP
SP2
LCH
SP1
LAR
E'
TR1
LIL1
E
130
GP
CT(C1)
GI
PO6
PO5
PO4
UGE
PO3
PO2
PO1
LGE
STP
ST
105
D3
D2
D1

CTR
RS1
C'
WV(W1)
PLH
ST
C
USD1
LSD1
130
CT(C1)
120
USD
110
LSD
105
D3
D2
D1

FIG. 15C

CTR
RS1 RS2
WV(W2)
USD3
LSD3
USD2
LSD2
PLH
ST
130
CT(C1)
120
USD
110
LSD
105
D
D'
D3
D2
D1

130
GP
CT(C1)
GI
P06
P05
P04
P03
P02
P01
ST
105
UGE
LGE
STP
D3
D2
D1
E
E'
RS1
RS2
CTR
WV(W2)
LIL1
TR1
GE
G1
SP4
SP3
UCH
UAR
SDL
DSP
SP2
SP1
LCH
LAR

THREE-DIMENSIONAL SEMICONDUCTOR DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2023-0111715, filed on Aug. 25, 2023, in the Korean Intellectual Property Office, the entire contents of which are hereby incorporated by reference.

BACKGROUND

Various example embodiments relate, in general, to a three-dimensional semiconductor device and/or a method of fabricating the same, and in particular, to a three-dimensional semiconductor device including a field effect transistor and/or a method of fabricating the same.

A semiconductor device includes an integrated circuit composed of metal-oxide-semiconductor field-effect transistors (MOS-FETs). To meet or improve upon an increasing demand for a semiconductor device with a small pattern size and a reduced design rule, the MOS-FETs are being aggressively scaled down. The scale-down of the MOS-FETs may lead to deterioration in operational properties of the semiconductor device. A variety of studies are being conducted to overcome or help overcome technical limitations associated with the scale-down of the semiconductor device and to realize high-performance semiconductor devices.

SUMMARY

Various example embodiments provide a three-dimensional semiconductor device with improved electrical characteristics and/or a method of fabricating the same.

According to some example embodiments, a three-dimensional (3D) semiconductor device may include a back-side metal layer, a lower channel pattern on the back-side metal layer, a first lower source/drain pattern and a second lower source/drain pattern spaced apart from each other in a first direction with the lower channel pattern interposed therebetween, the first lower source/drain pattern connected to the lower channel pattern, an upper channel pattern on the lower channel pattern, a first upper source/drain pattern on the first lower source/drain pattern, the first upper source/drain pattern connected to the upper channel pattern, a second upper source/drain pattern on the second lower source/drain pattern, and a wide via electrically connecting the first upper source/drain pattern to the second lower source/drain pattern. The wide via may include a first via portion having a first top surface and a second via portion having a second top surface at a level lower than the first top surface.

Alternatively or additionally according to various example embodiments, a three-dimensional (3D) semiconductor device may include a back-side metal layer, a lower channel pattern on the back-side metal layer, a first lower source/drain pattern and a second lower source/drain pattern, spaced apart from each other in a first direction with the lower channel pattern interposed therebetween, the first lower source/drain pattern connected to the lower channel pattern, an upper channel pattern on the lower channel pattern, a first upper source/drain pattern on the first lower source/drain pattern, the first upper source/drain pattern connected to the upper channel pattern, a second upper source/drain pattern on the second lower source/drain pattern, and a wide via electrically connecting the first upper source/drain pattern to the second lower source/drain pattern. A lower portion of the wide via may protrude more in the first direction, compared to an upper portion of the wide via.

Alternatively or additionally according to various example embodiments, a three-dimensional (3D) semiconductor device may include a back-side metal layer, a lower channel pattern and an upper channel pattern sequentially placed on the back-side metal layer, a gate electrode crossing the lower and upper channel patterns, a first lower source/drain pattern connected to the lower channel pattern in a first direction, a first upper source/drain pattern on the first lower source/drain pattern and connected to the upper channel pattern in the first direction, a cutting pattern adjacent to the gate electrode in a second direction crossing the first direction, and a wide via in the cutting pattern and electrically connected to the first upper source/drain pattern. The cutting pattern may cover a portion of a top surface of the wide via.

Alternatively or additionally according to various example embodiments, a three-dimensional (3D) semiconductor device may include a back-side metal layer, a lower channel pattern on the back-side metal layer, a first lower source/drain pattern and a second lower source/drain pattern spaced apart from each other in a first direction with the lower channel pattern interposed therebetween, the first lower source/drain pattern connected to the lower channel pattern, an upper channel pattern on the lower channel pattern, a first upper source/drain pattern on the first lower source/drain pattern, the first upper source/drain pattern connected to the upper channel pattern, a second upper source/drain pattern on the second lower source/drain pattern, a first upper active contact electrically connected to the first upper source/drain pattern, a second upper active contact electrically connected to the second upper source/drain pattern, a first lower contact electrically connected to the first lower source/drain pattern, a second lower contact electrically connected to the second lower source/drain pattern, a gate electrode between the first upper source/drain pattern and the second upper source/drain pattern, a cutting pattern adjacent to the gate electrode in a second direction crossing the first direction, and a wide via, which is placed in the cutting pattern to electrically connect the first upper active contact to the second lower contact. The wide via may include a first via portion having a first top surface and a second via portion having a second top surface at a level lower than the first top surface.

BRIEF DESCRIPTION OF THE DRAWINGS

FIGS. 5A to 5E are sectional views taken along lines A-A', B-B', C-C', D-D', and E-E', respectively, of FIG. 3.

FIGS. 7A and 7B are sectional views taken along lines B-B' and E-E', respectively, of FIG. 3.

FIGS. 9A and 9B are enlarged plan views illustrating a portion 'P2' of FIG. 8.

Figure 14A:
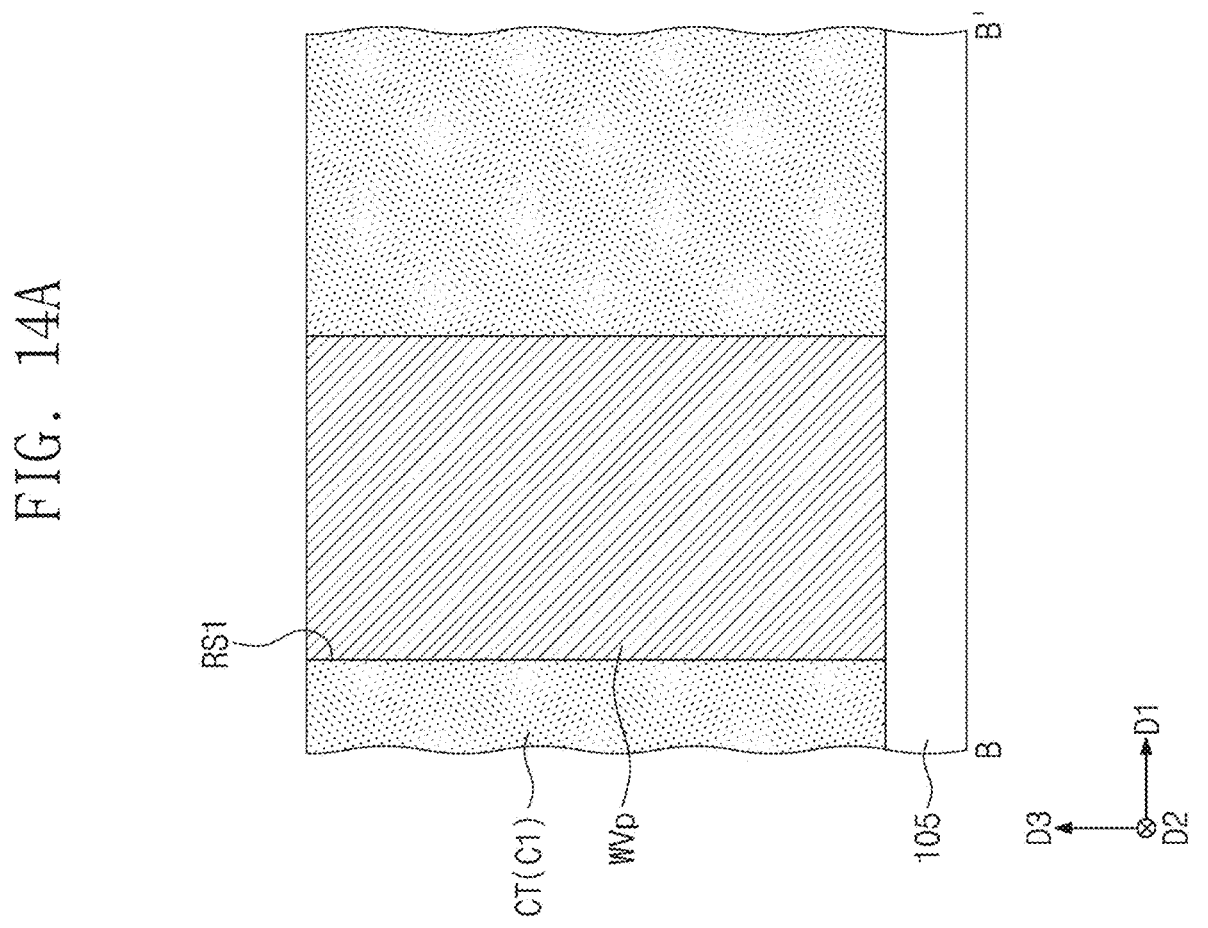
Figure 14B:
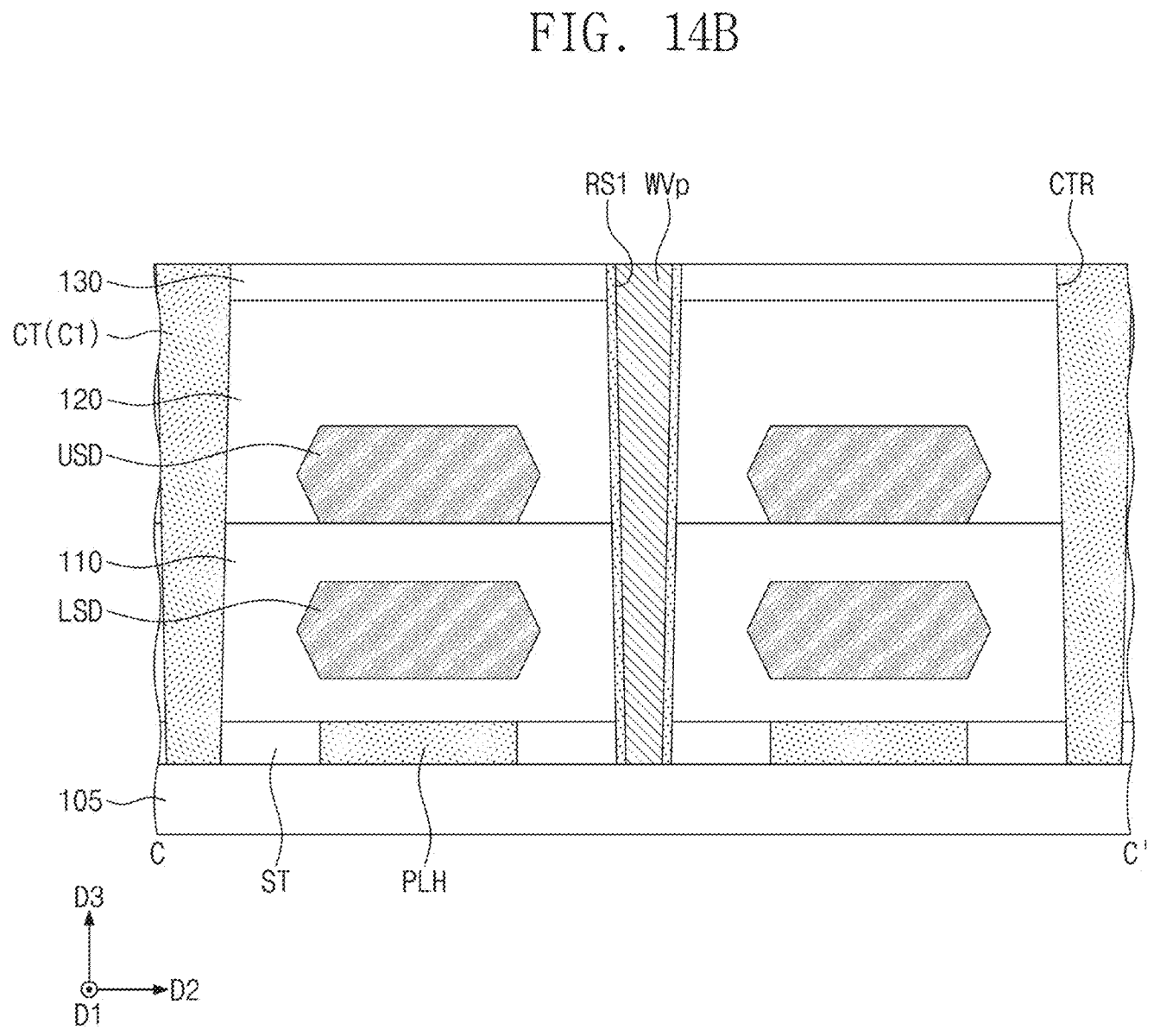
Figure 15A:
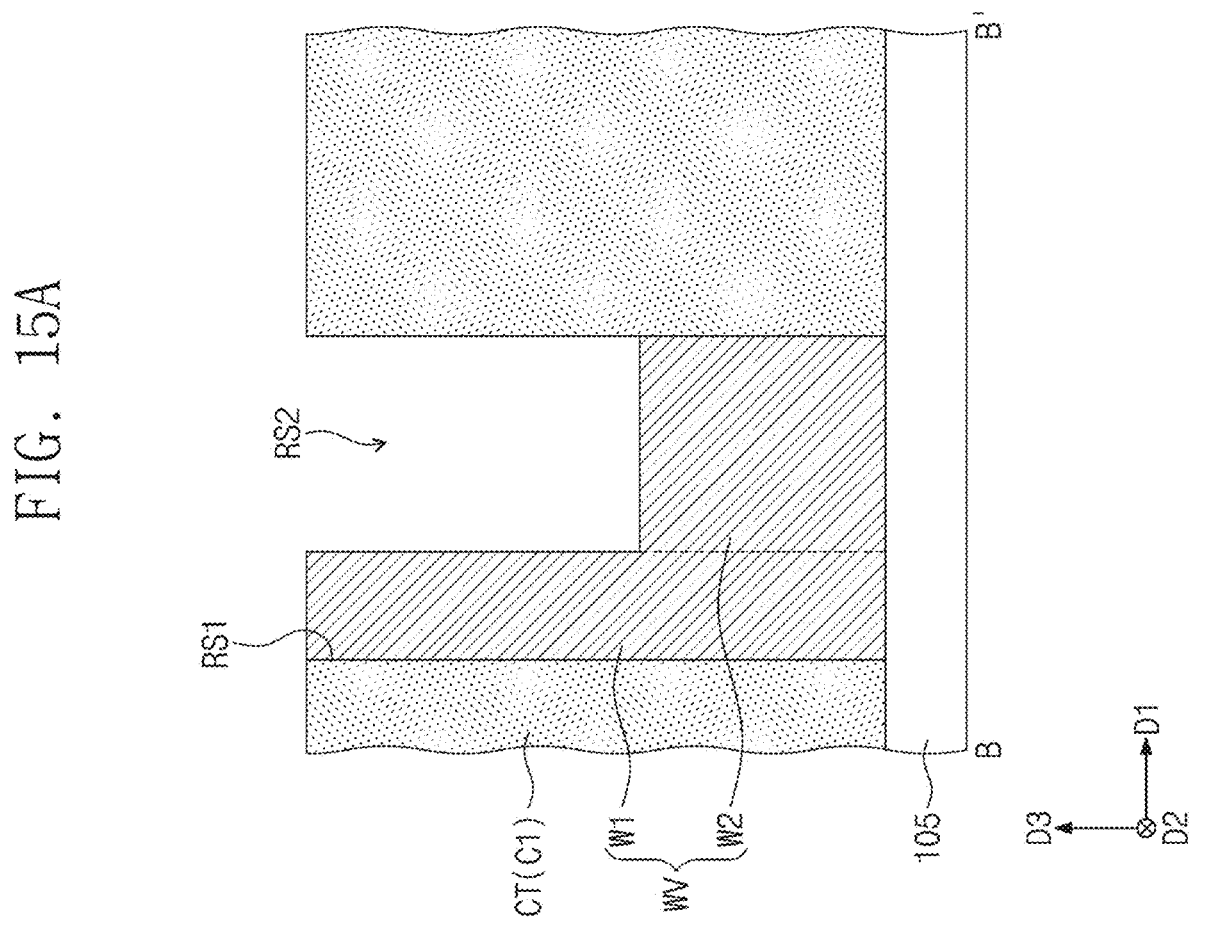
Figure 15B:
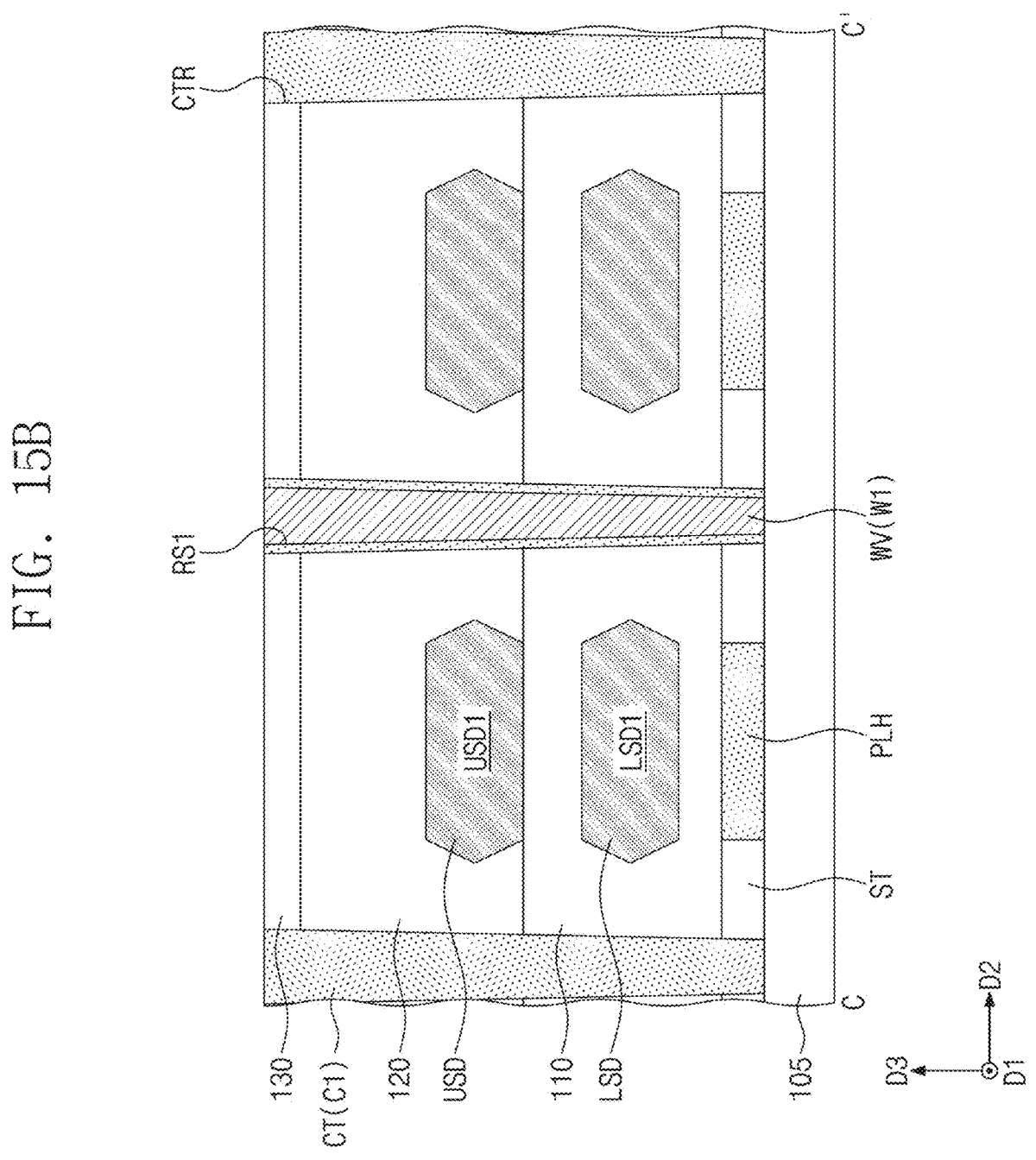
Figure 15C:
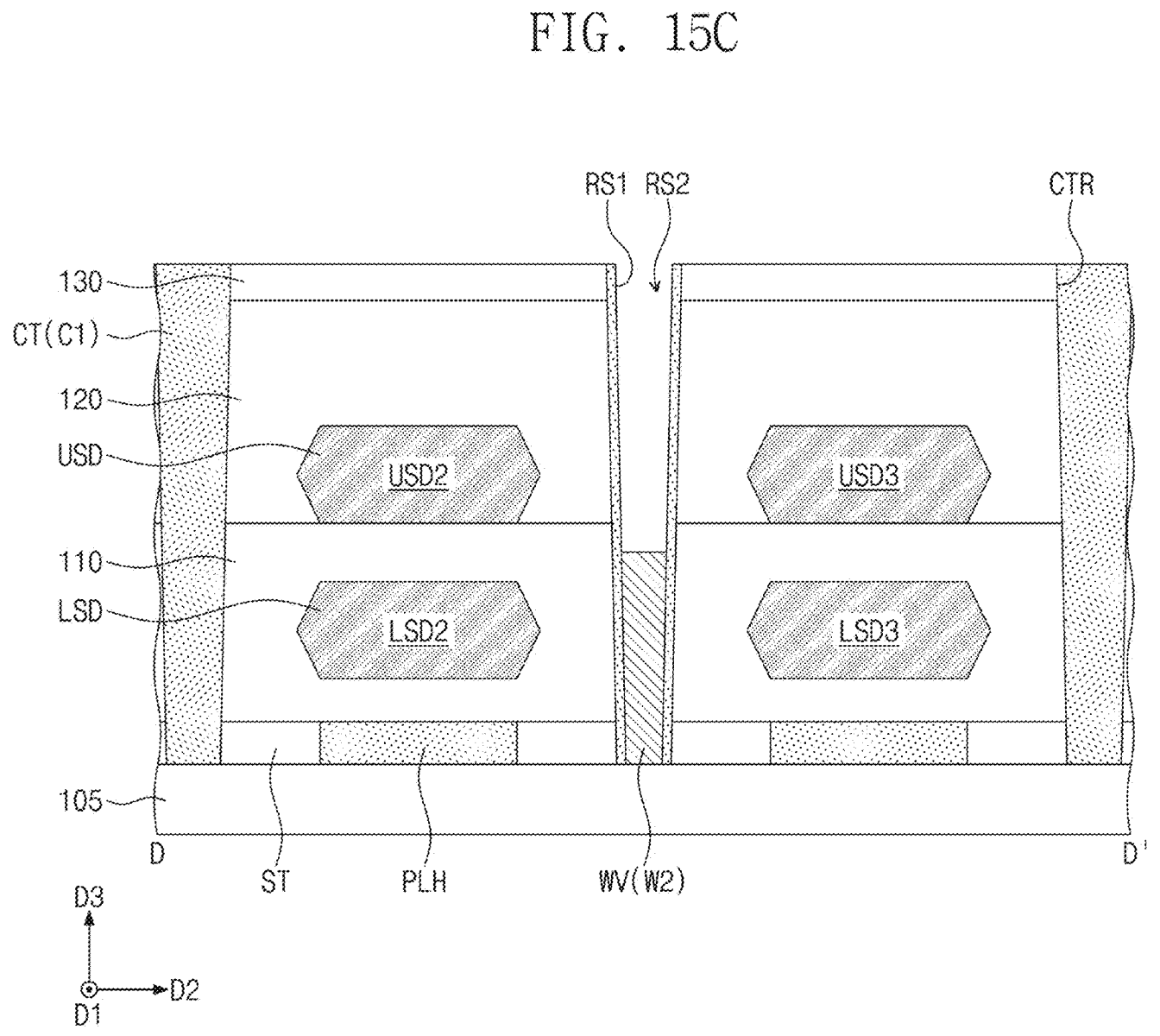

FIGS. 10A to 15D are sectional views illustrating a method of fabricating a three-dimensional semiconductor device, according to various example embodiments.

DETAILED DESCRIPTION

Various example embodiments will now be described more fully with reference to the accompanying drawings, in which some example features are shown.

Figure 1:
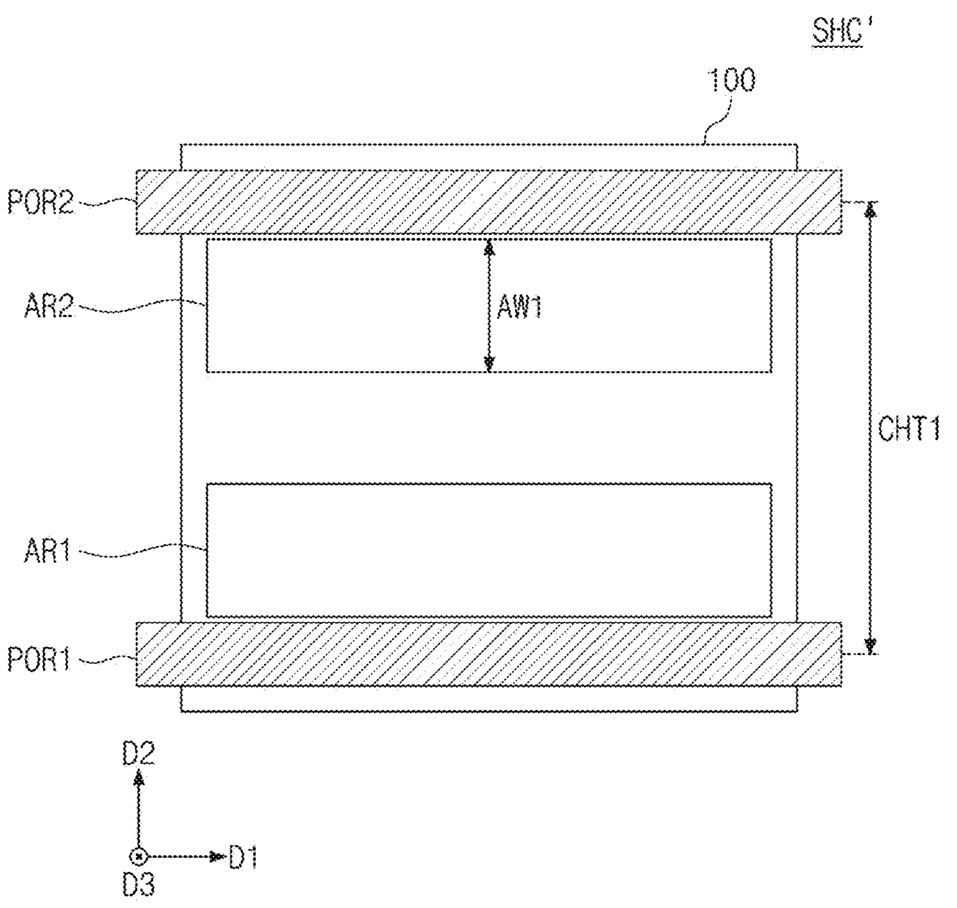
FIG. 1 is a conceptual diagram illustrating a logic cell of a semiconductor device according to a comparative example.

FIG. 1 is a conceptual diagram illustrating a logic cell of a semiconductor device according to a comparative example.

Referring to FIG. 1, a single height cell SHC' may be provided. In detail, a first power line POR1 and a second power line POR2 may be provided on a substrate 100. A drain voltage VDD (e.g., a power voltage) may be applied to one of the first and second power lines POR1 and POR2. A source voltage VSS (e.g., a ground voltage) may be applied to the other of the first and second power lines POR1 and POR2. In various example embodiments, the source voltage VSS may be applied to the first power line POR1, and the drain voltage VDD may be applied to the second power line POR2. The first and second power lines POR1 and POR2 may extend in a first direction D1, which is parallel to a bottom surface of the substrate 100, and may be spaced apart from each other in a second direction D2, which is parallel to the bottom surface of the substrate 100 but is not parallel to the first direction D1.

The single height cell SHC' may be defined between the first and second power lines POR1 and POR2. The single height cell SHC' may include a first active region AR1 and a second active region AR2. One of the first and second active regions AR1 and AR2 may be or may correspond to a PMOSFET region, and the other of the first and second active regions AR1 and AR2 may be or may correspond to an NMOSFET region. For example, the first active region AR1 may be or be included in an NMOSFET region, and the second active region AR2 may be or be included in a PMOSFET region. For example, the single height cell SHC' may include a CMOS structure that is provided between the first and second power lines POR1 and POR2.

The semiconductor device according to the comparative example may be or may correspond to a two-dimensional device, in which the transistors of the front-end-of-line (FEOL) layer are two-dimensionally arranged. For example, an NMOSFET of the first active region AR1 may be spaced apart from a PMOSFET of the second active region AR2 in a second direction D2.

Each of the first and second active regions AR1 and AR2 may have a first width AW1 in the second direction D2, that may be the same as each other. In the comparative example, a length of the single height cell SHC' in the second direction D2 may be defined as a first height CHT1. The first height CHT1 may be substantially equal to a distance (e.g., pitch) between the first and second power lines POR1 and POR2.

The single height cell SHC' may constitute or may correspond to a single logic cell. As described herein, the logic cell may indicate a logic device (e.g., a standard cell such as a NAND, NOR, AND, OR, XOR, XNOR, inverter, and so forth), which is configured to execute a specific function. For example, the logic cell may include transistors, such as one or more NMOS and/or PMOS transistors, constituting the logic device, as well as interconnection lines connecting the transistors to each other.

In the comparative example, since the single height cell SHC' includes a two-dimensional device, the first and second active regions AR1 and AR2 may not be overlapped with each other and may be spaced apart from each other in the second direction D2. Thus, the first height CHT1 of the single height cell SHC' should be defined to span both the first and second active regions AR1 and AR2, which are spaced apart from each other in the second direction D2. Accordingly, the first height CHT1 of the single height cell SHC' may be given to be larger than at least two times the first width AW1. As a result, the first height CHT1 of the single height cell SHC' in the comparative example is larger than a second height CHT2 of a single height cell SHC, which will be described below. For example, the single height cell SHC' in the comparative example may have a relatively large area.

Figure 2:
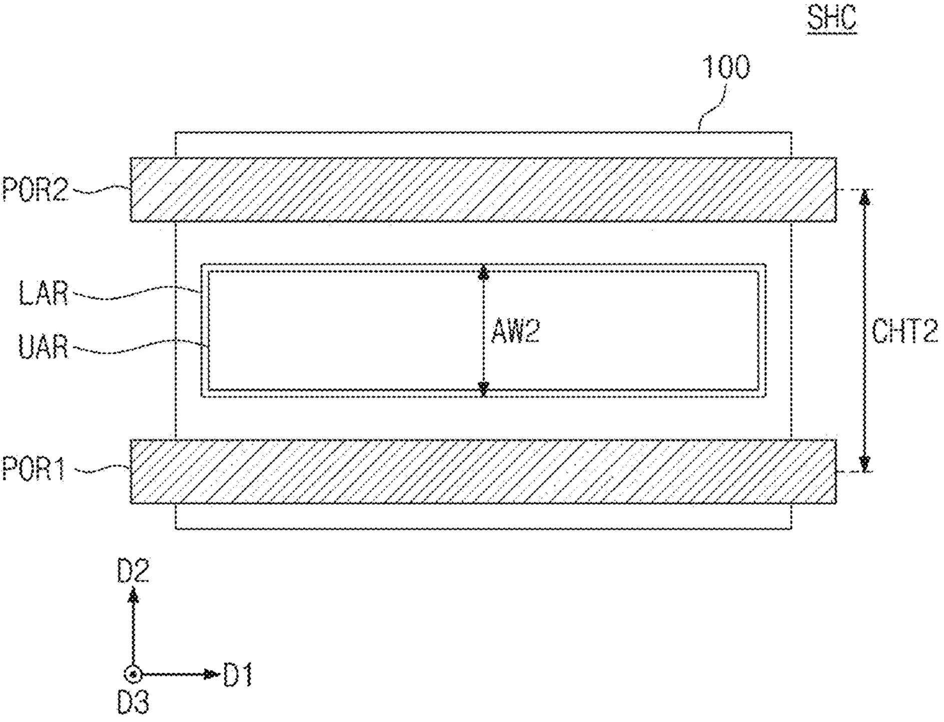
FIG. 2 is a conceptual diagram illustrating a logic cell of a semiconductor device according to various example embodiments.

FIG. 2 is a conceptual diagram illustrating a logic cell of a semiconductor device according to various example embodiments.

Referring to FIG. 2, a single height cell SHC, which includes a three-dimensional device with stacked transistors, may be provided. In detail, the first and second power lines POR1 and POR2 may be provided on the substrate 100. The single height cell SHC may be defined between the first power line POR1 and the second power line POR2.

The single height cell SHC may include lower and upper active regions LAR and UAR. One of the lower and upper active regions LAR and UAR may be or may include or be included in a PMOSFET region, and the other of the lower and upper active regions LAR and UAR may be or may include or be included in an NMOSFET region.

In some example embodiments, the semiconductor device may be or may include a three-dimensional device, in which the transistors of the FEOL layer are vertically stacked. The lower active region LAR serving as a bottom tier may be provided on the substrate 100, and the upper active region UAR serving as a top tier may be stacked on the lower active region LAR. For example, the PMOSFET of the lower active region LAR may be provided on the substrate 100, and the NMOSFET of the upper active region UAR may be stacked on the PMOSFET; however, example embodiments are not limited thereto, and in some example embodiments, the PMOSFET may be stacked on the NMSOFET. The lower and upper active regions LAR and UAR may be spaced apart from each other in a vertical direction (e.g., in a third direction D3 perpendicular to the bottom surface of the substrate 100).

Each of the lower and upper active regions LAR and UAR may have a second width AW2 in the second direction D2. In some example embodiments, a length of the single height cell SHC in the second direction D2 may be defined as a second height CHT2.

Since the single height cell SHC according to various example embodiments includes the three-dimensional device (e.g., the stacked transistors), the lower and upper active regions LAR and UAR may overlap with each other. Thus, the second height CHT2 of the single height cell SHC may have a size spanning a single active region or may be larger than the second width AW2. As a result, the second height CHT2 of the single height cell SHC according to various example embodiments may be smaller than the first height CHT1 of the single height cell SHC' of FIG. 1 described above. For example, the single height cell SHC in the present embodiment may have a relatively small area. In the three-dimensional semiconductor device according to various example embodiments, an integration density of the device may be increased by reducing an area of the logic cell. In some example embodiments, one or more of a yield, a reliability, a productivity, or an efficiency may be improved.

Figure 3:
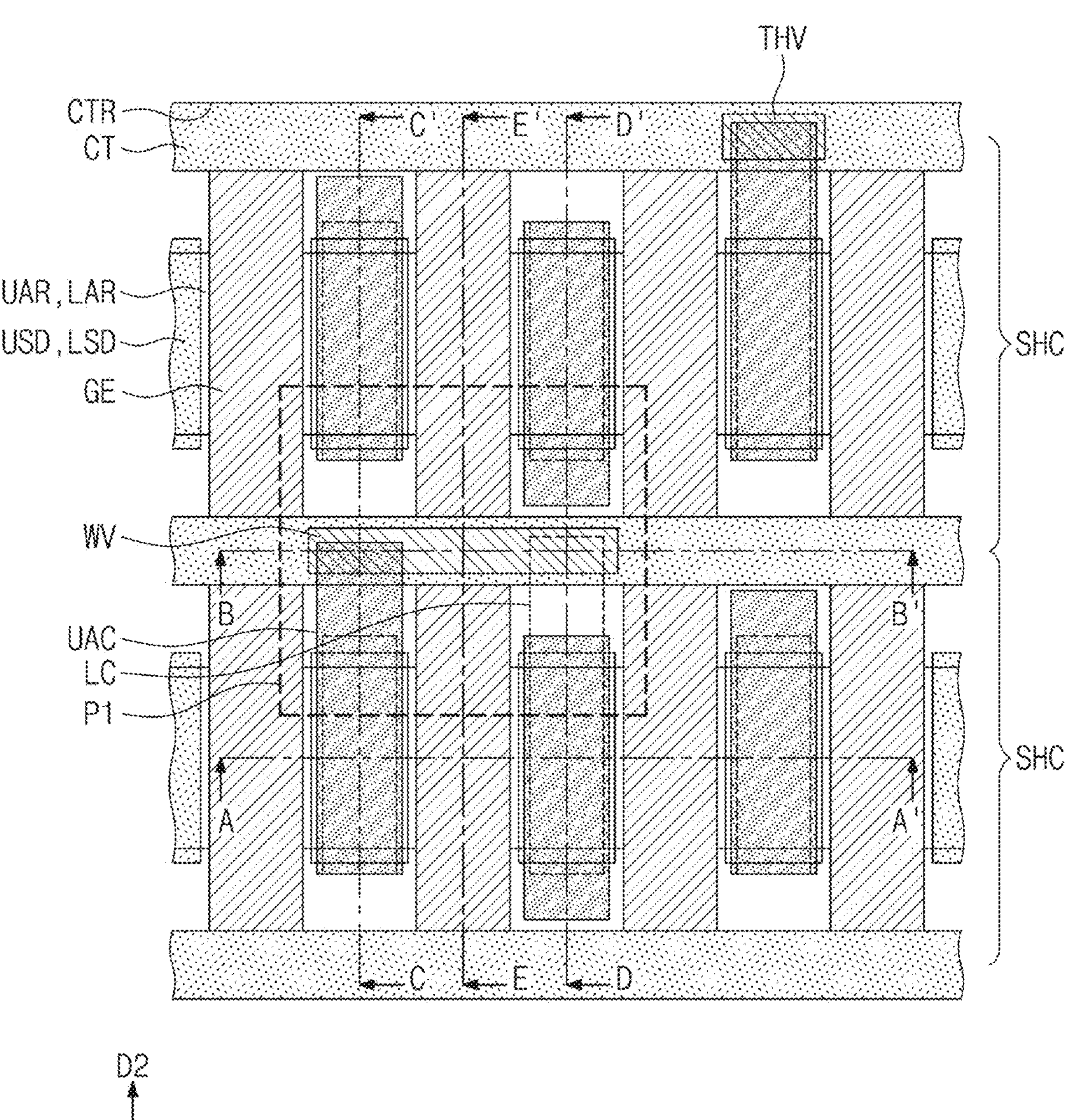
FIG. 3 is a plan view illustrating a three-dimensional semiconductor device according to various example embodiments.
Figure 4:
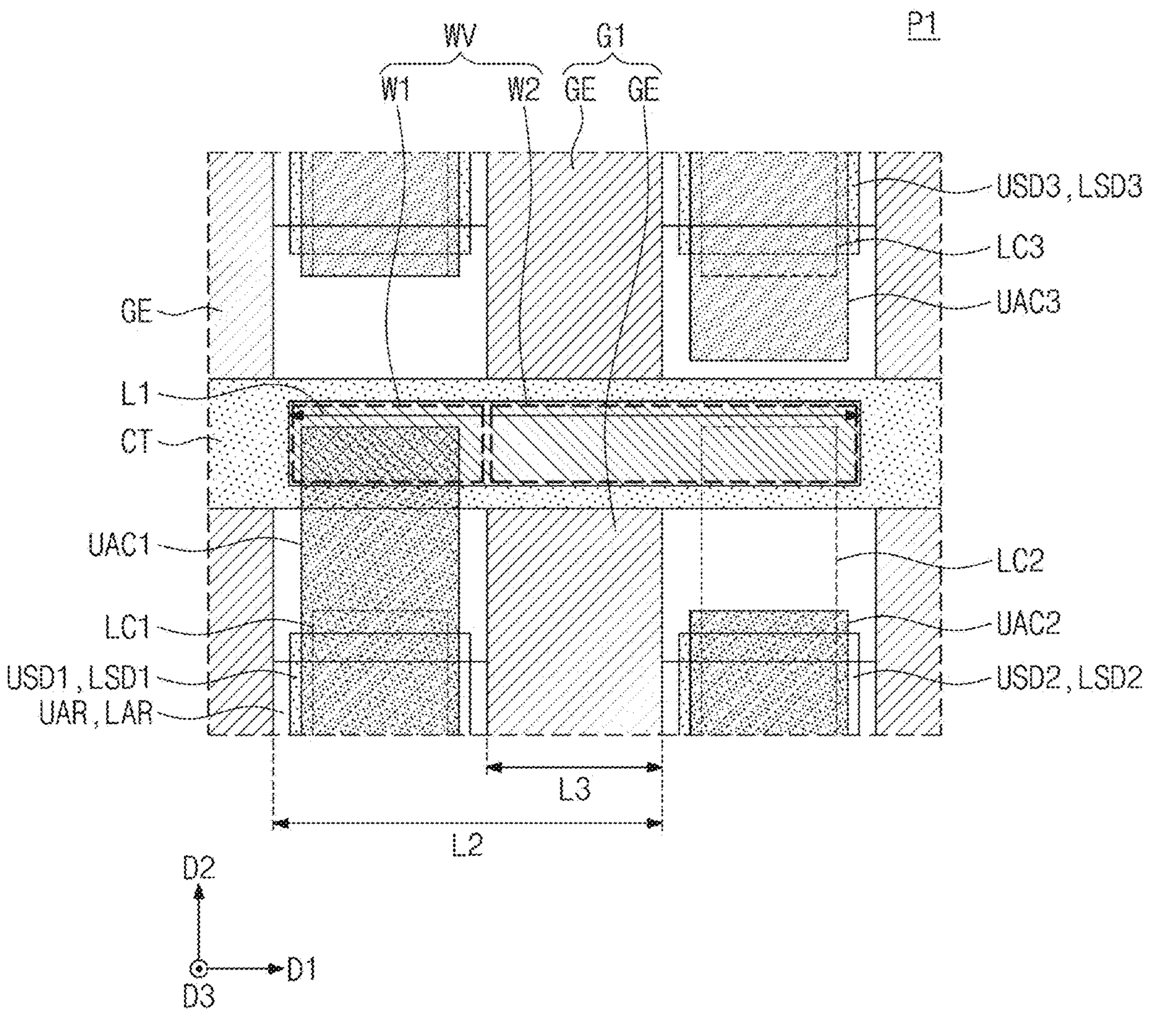
FIG. 4 is an enlarged plan view illustrating a portion 'P1' of FIG. 3.
Figure 5A:
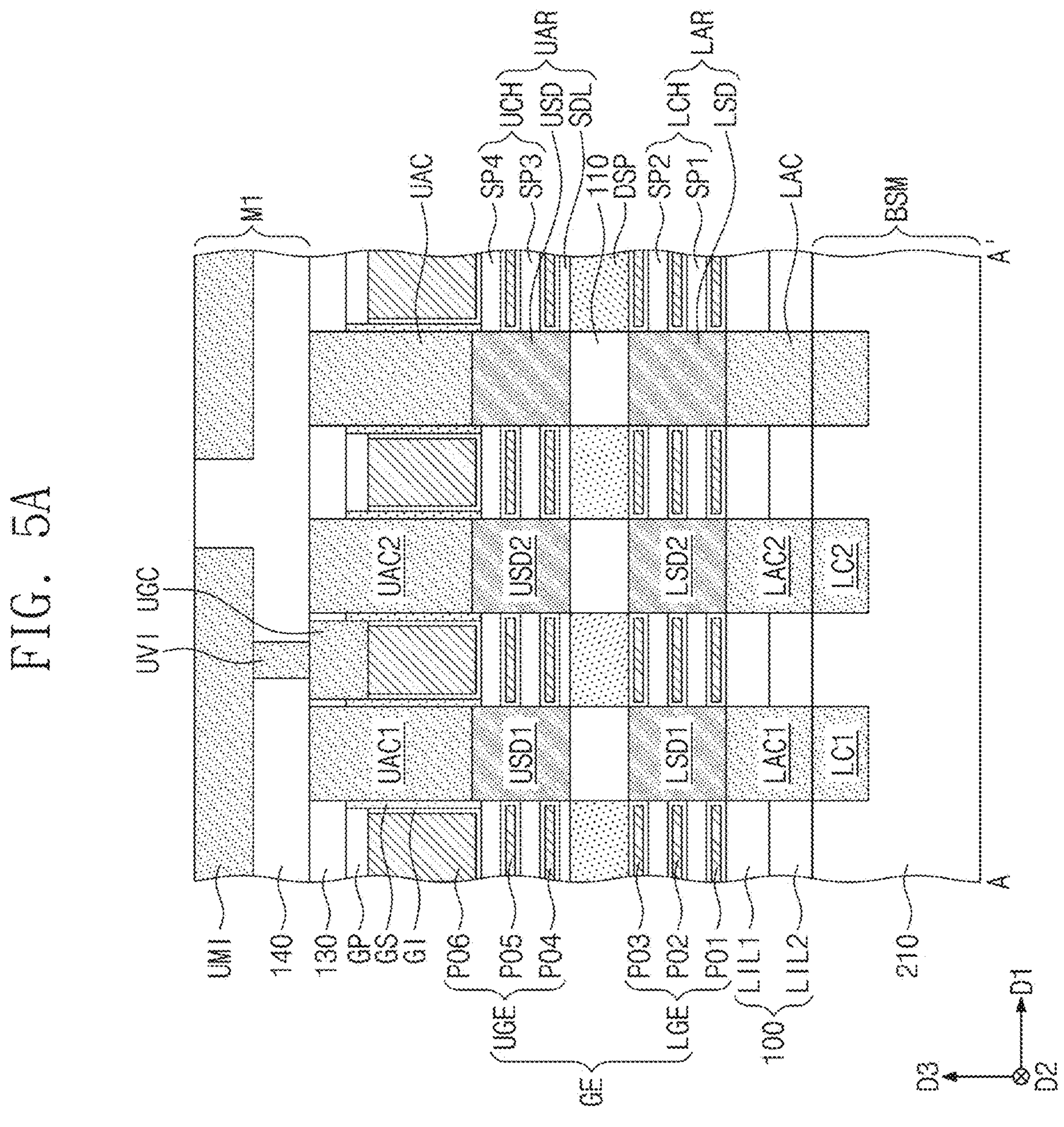
Figure 5B:
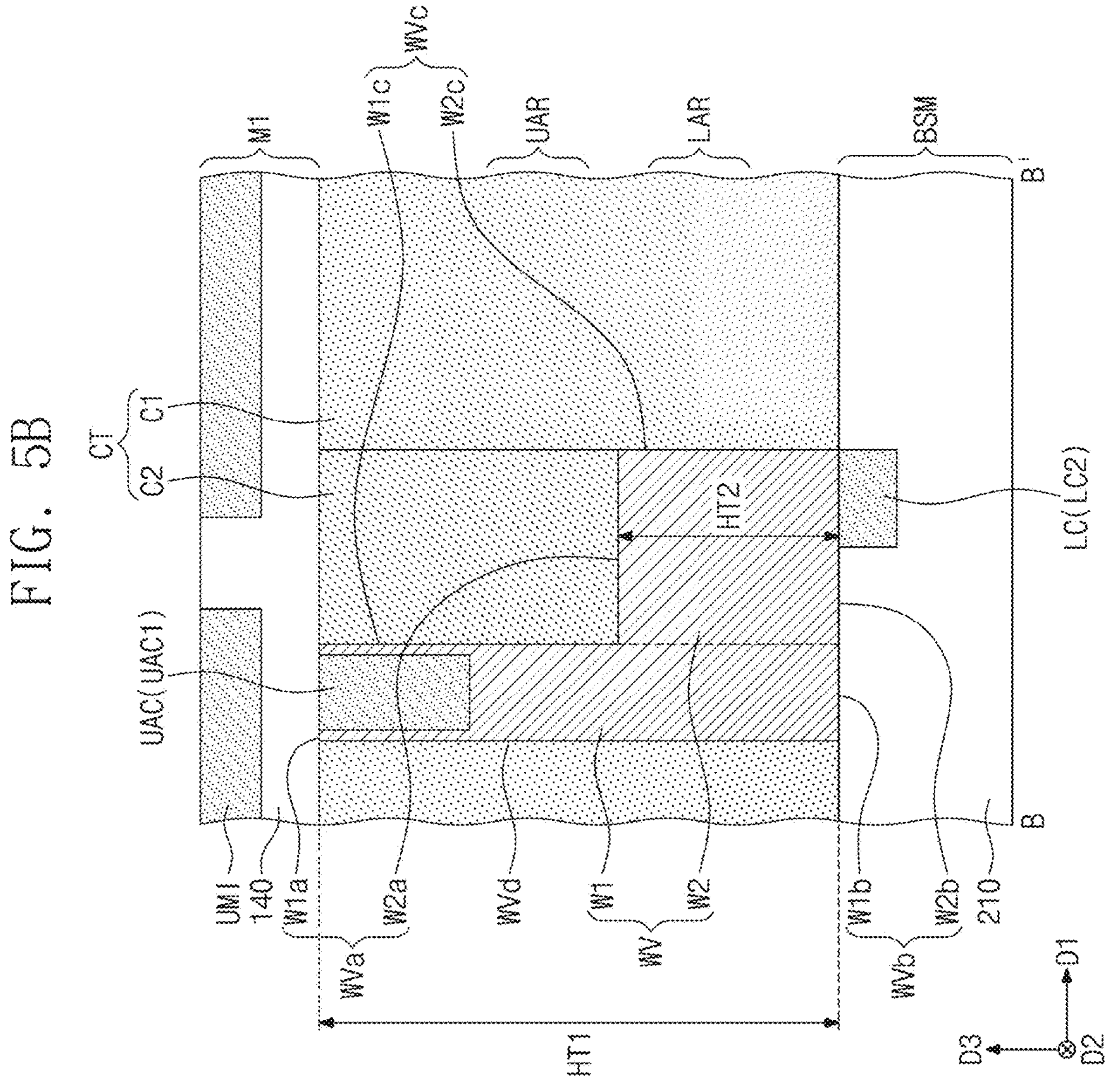
Figure 5C:
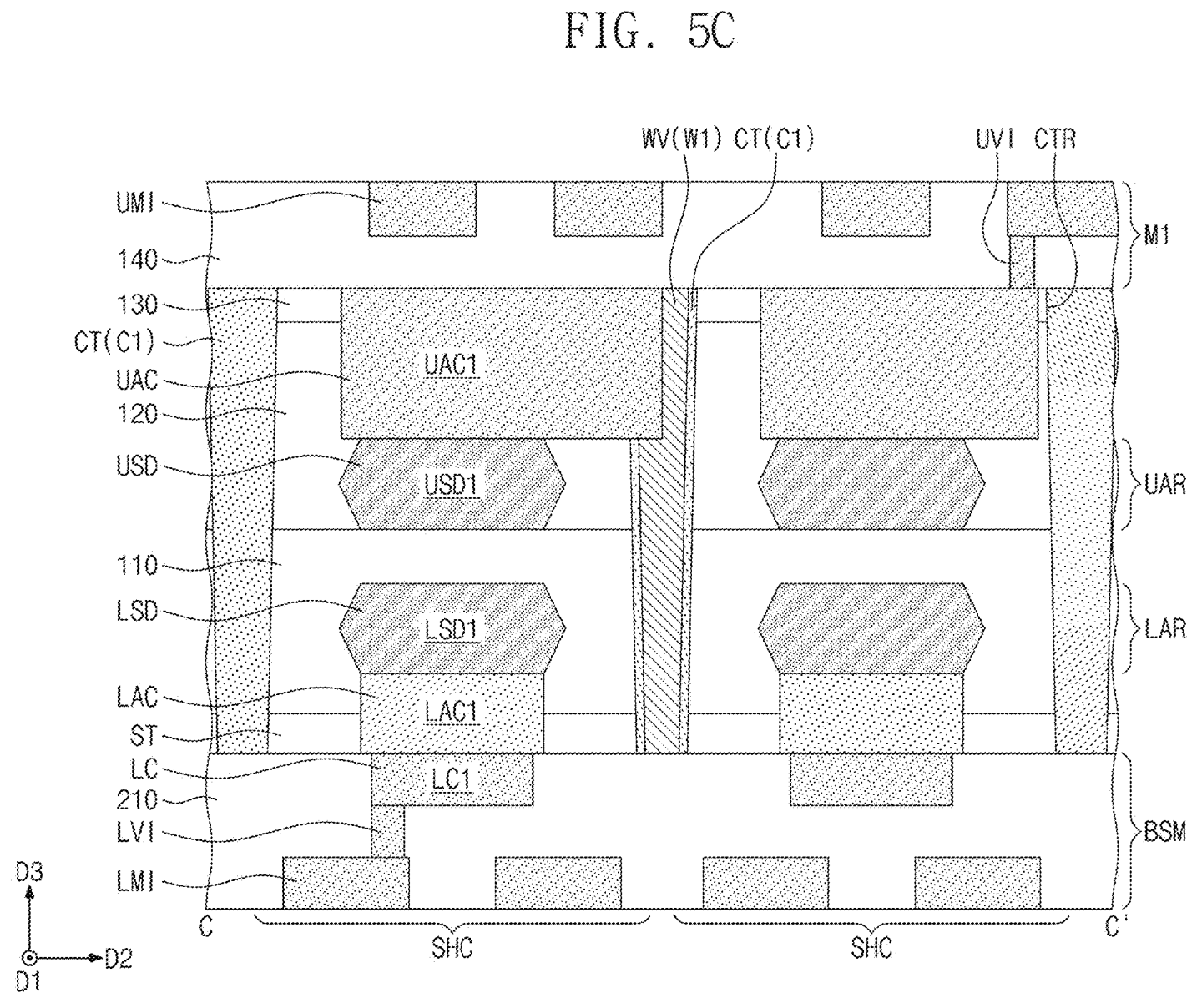
Figure 5D:
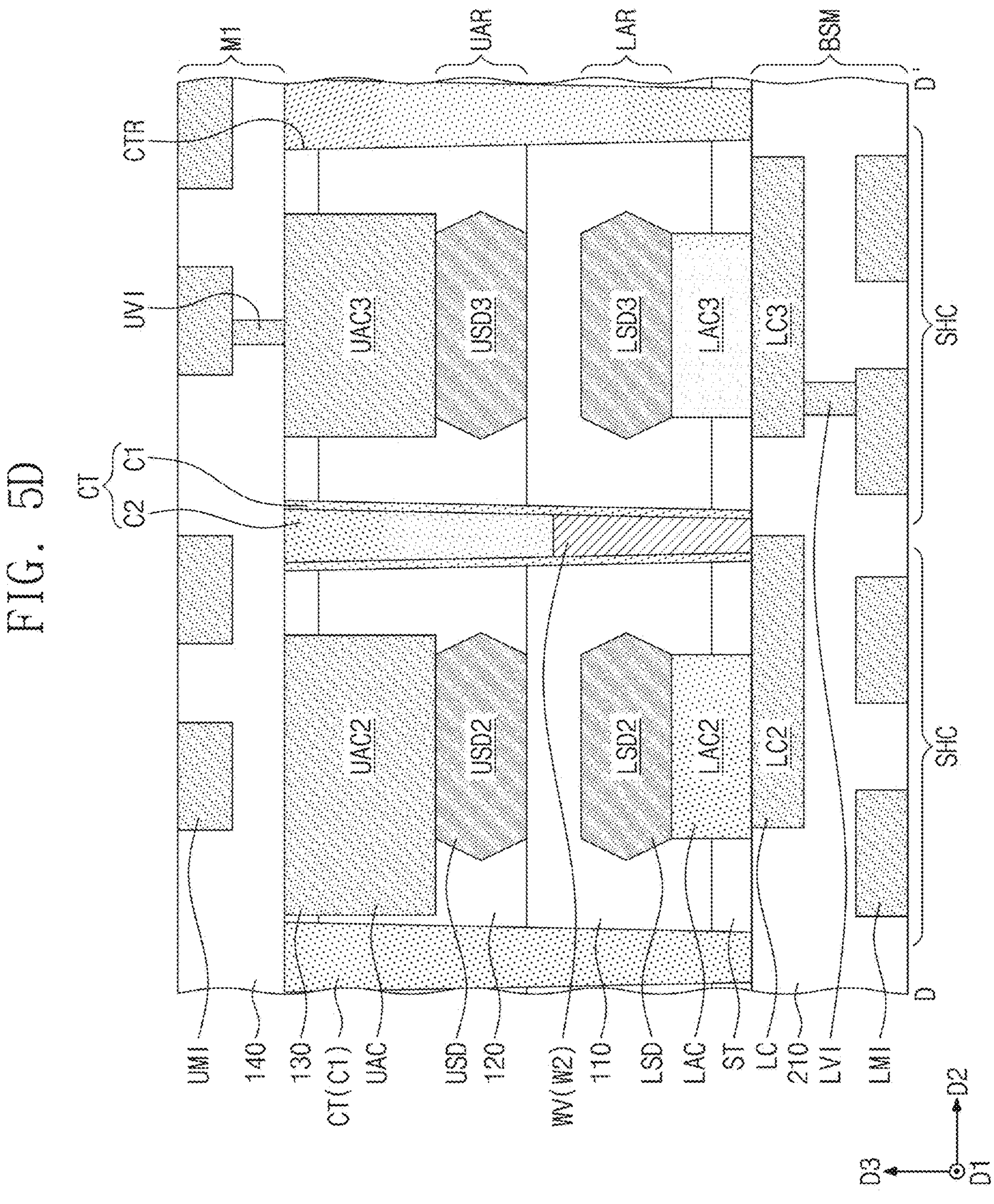
Figure 5E:
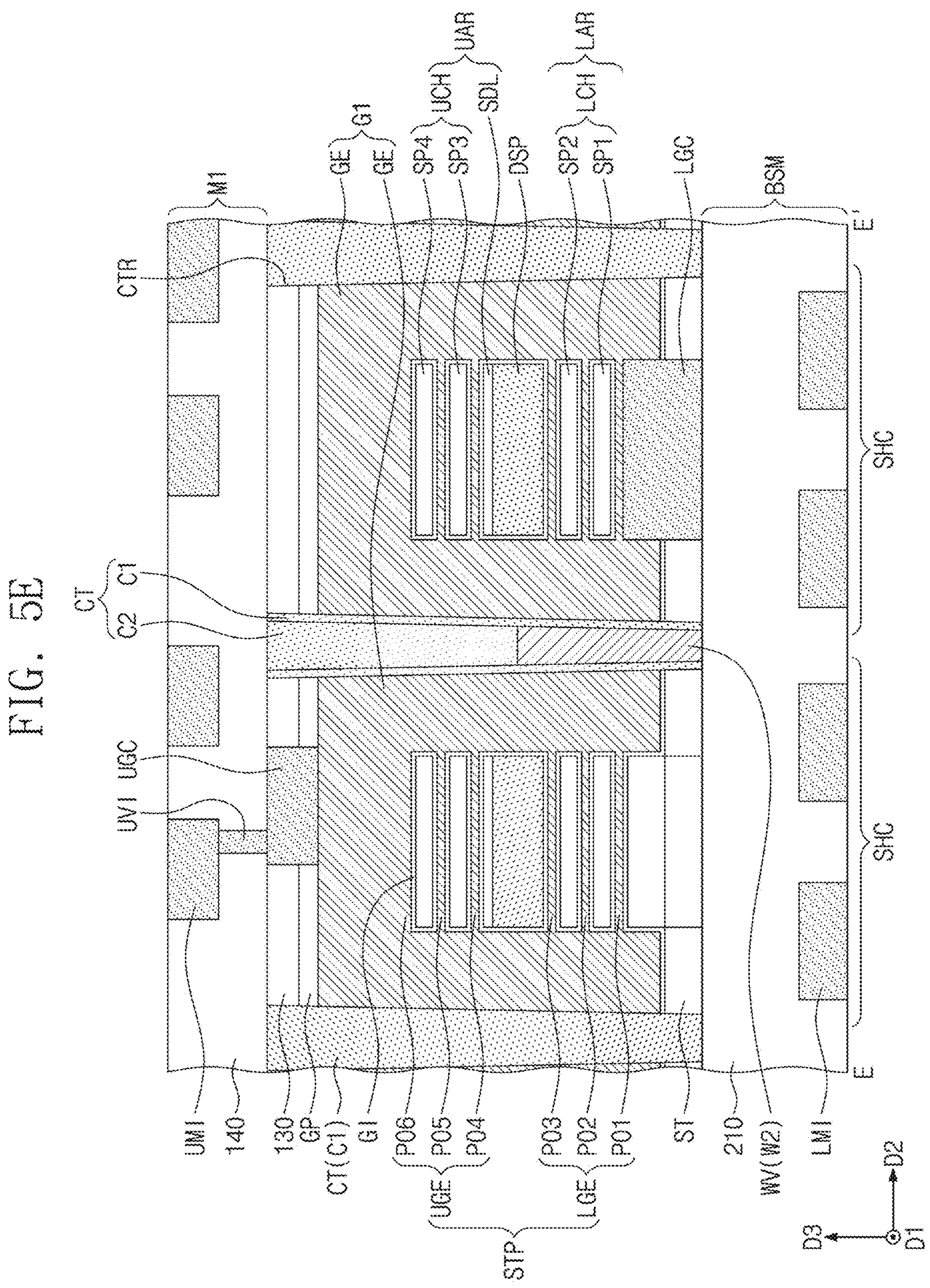

FIG. 3 is a plan view illustrating a three-dimensional semiconductor device according to various example embodiments. FIG. 4 is an enlarged plan view illustrating a portion 'P1' of FIG. 3. FIGS. 5A to 5E are sectional views taken along lines A-A', B-B', C-C', D-D', and E-E', respectively, of FIG. 3.

Referring to FIGS. 3 to 5E, a single height cells SHC may be provided on the substrate 100. In various example embodiments, the substrate 100 may be or may include or be included in an insulating substrate, which is formed of or includes a silicon-based insulating material (e.g., silicon oxide and/or silicon nitride). In various example embodiments, the substrate 100 may be or may include or be included in a semiconductor substrate made of one or more of silicon, germanium, or silicon germanium.

In various example embodiments, the substrate 100 may include a first lower insulating layer LIL1 and a second lower insulating layer LIL2. The first lower insulating layer LIL1 may be provided on the second lower insulating layer LIL2. The first lower insulating layer LIL1 may be formed of or include at least one of silicon-based insulating materials (e.g., silicon oxide) and/or semiconductor materials (Si or SiGe). The second lower insulating layer LIL2 may be formed of or include at least one of silicon-based insulating materials (e.g., silicon oxide, silicon oxynitride, or silicon nitride).

A device isolation layer ST may be provided in the substrate 100. The device isolation layer ST may define the single height cell SHC. The device isolation layer ST may be interposed between a back-side metal layer BSM and a first interlayer insulating layer 110, which will be described below. In various example embodiments, the device isolation layer ST may be formed of or include at least one of silicon-based insulating materials (e.g., one or more of silicon oxide, silicon oxynitride, or silicon nitride).

In various example embodiments, each of the single height cells SHC may be or may correspond to a logic cell constituting a logic circuit. Each of the single height cells SHC may be or may correspond to a logic cell, which includes a three-dimensional device previously described with reference to FIG. 2. The single height cells SHC may be arranged in the second direction D2.

Each of the single height cells SHC may include the lower and upper active regions LAR and UAR, which are sequentially stacked on the substrate 100. One of the lower and upper active regions LAR and UAR may be a PMOSFET region, and the other of the lower and upper active regions LAR and UAR may be an NMOSFET region. The lower active region LAR may be provided as a bottom tier of the FEOL layer, and the upper active region UAR may be provided as a top tier of the FEOL layer. The NMOSFET and PMOSFET of the lower and upper active regions LAR and UAR may be vertically stacked to constitute transistors, which are three-dimensionally stacked. In various example embodiments, the lower active region LAR may be a PMOSFET region, and the upper active region UAR may be an NMOSFET region; however, example embodiments are not limited thereto. Each of the lower and upper active regions LAR and UAR may independently or concurrently be a bar- or line-shaped region that is extended in the first direction D1.

The lower active region LAR may include lower channel patterns LCH and lower source/drain patterns LSD. The lower channel pattern LCH may be interposed between a pair of the lower source/drain patterns LSD. The lower channel pattern LCH may connect the paired lower source/drain patterns LSD to each other.

The lower channel pattern LCH may include a first semiconductor pattern SP1 and a second semiconductor pattern SP2, which are stacked to be spaced apart from each other. Each of the first and second semiconductor patterns SP1 and SP2 may be formed of or include at least one of silicon (Si), germanium (Ge), or silicon germanium (SiGe). In various example embodiments, each of the first and second semiconductor patterns SP1 and SP2 may be formed of or include crystalline silicon. Each of the first and second semiconductor patterns SP1 and SP2 may be a nanosheet. As an example, the lower channel pattern LCH may further include one or more semiconductor patterns, which are stacked and are spaced apart from the second semiconductor pattern SP2.

The lower source/drain patterns LSD may be provided on the substrate 100. Each of the lower source/drain patterns LSD may be an epitaxial pattern, which is formed by a selective epitaxial growth (SEG) process such as a homogenous or heterogenous SEG process. In various example embodiments, a top surface of the lower source/drain pattern LSD may be higher than a top surface of the second semiconductor pattern SP2 of the lower channel pattern LCH.

The lower source/drain patterns LSD may be doped with impurities to have a first conductivity type. The first conductivity type may be an n- or p-type. In some example embodiments, the first conductivity type may be a p-type. The lower source/drain patterns LSD may be formed of or include silicon (Si) and/or silicon germanium (SiGe). In some example embodiments, the lower source/drain patterns LSD may be doped with impurities of n-type at a high concentration and also with impurities of p-type at a low, e.g., a much lower concentration; example embodiments are not limited thereto.

A first interlayer insulating layer 110 may be provided on the lower source/drain pattern LSD. The first interlayer insulating layer 110 may cover the lower source/drain patterns LSD.

A lower active contact LAC may be provided below the lower source/drain pattern LSD. The lower active contact LAC may be electrically connected to the lower source/drain pattern LSD. The lower active contact LAC may be buried or at least partially buried in the substrate 100. The lower active contact LAC may vertically extend from the top surface of the substrate 100 to the bottom surface. The lower active contact LAC may be formed of or include at least one metallic material that is selected from the group consisting of or including at least one of copper (Cu), aluminum (Al), ruthenium (Ru), cobalt (Co), tungsten (W), and molybdenum (Mo).

The upper active region UAR may be provided on the first interlayer insulating layer 110. The upper active region UAR may include upper channel patterns UCH and upper source/drain patterns USD. The upper channel patterns UCH may vertically overlap with the lower channel patterns LCH, respectively. The upper source/drain patterns USD may vertically overlap with the lower source/drain patterns LSD, respectively. The upper channel pattern UCH may be interposed between a pair of the upper source/drain patterns USD. The upper channel pattern UCH may connect the paired upper source/drain patterns USD to each other.

The upper channel pattern UCH may include a third semiconductor pattern SP3 and a fourth semiconductor pattern SP4, which are stacked to be spaced apart from each other. The third and fourth semiconductor patterns SP3 and SP4 of the upper channel pattern UCH may include the same semiconductor material as the first and second semiconductor patterns SP1 and SP2 of the lower channel pattern LCH. Each of the third and fourth semiconductor patterns SP3 and SP4 may be a nanosheet. As an example, the upper channel pattern UCH may further include one or more semiconductor patterns that are stacked and are spaced apart from the fourth semiconductor pattern SP4. The number of semiconductor patterns SP3 and SP4 included in the upper channel pattern UCH may be the same as, or greater than, or less than the number of semiconductor patterns SP1 and SP2 included in the lower channel pattern LCH.

At least one dummy channel pattern DSP may be interposed between the lower channel pattern LCH and the upper channel pattern UCH thereon. A seed layer SDL may be interposed between the dummy channel pattern DSP and the upper channel pattern UCH.

The dummy channel pattern DSP may be spaced apart from the lower and upper source/drain patterns LSD and USD. In some example embodiments, the dummy channel pattern DSP may not be connected to any source/drain pattern. The dummy channel pattern DSP may be formed of or include at least one of semiconductor materials (e.g., one or more of silicon (Si), germanium (Ge), or silicon germanium (SiGe)) or silicon-based insulating materials (e.g., silicon oxide or silicon nitride). In various example embodiments, the dummy channel pattern DSP may be formed of or include at least one of the silicon-based insulating materials. In some example embodiments, the dummy channel pattern DSP may provide mechanical support and/or may improve the fabrication of the semiconductor device.

The upper source/drain patterns USD may be provided on a top surface of the first interlayer insulating layer 110. Each of the upper source/drain patterns USD may be an epitaxial pattern, which is formed by a selective epitaxial growth (SEG) process such as a homogenous SEG process and/or a heterogenous SEG process. In various example embodiments, a top surface of the upper source/drain pattern USD may be higher than a top surface of the fourth semiconductor pattern SP4 of the upper channel pattern UCH.

The upper source/drain patterns USD may be doped with impurities to have a second conductivity type. The second conductivity type may be different from the first conductivity type of the lower source/drain pattern LSD. The second conductivity type may be an n-type. In some example embodiments, the upper source/drain patterns USD may be doped with impurities of p-type at a high concentration and also with impurities of n-type at a low, e.g., a much lower concentration; example embodiments are not limited thereto. The upper source/drain patterns USD may be formed of or include at least one of silicon germanium (SiGe) and/or silicon (Si), and may or may not include the same material as that included in the lower source/drain patterns LSD.

A plurality of gate electrodes GE may be provided on the single height cell SHC. In detail, the gate electrode GE may be provided on the stacked lower and upper channel patterns LCH and UCH. When viewed in a plan view, the gate electrode GE may be a bar-shaped pattern, which is extended in the second direction D2. The gate electrode GE may be vertically overlapped and intersected with the stacked lower and upper channel patterns LCH and UCH.

The gate electrodes GE may be spaced apart from each other in the first and second directions D1 and D2. As an example, the gate electrodes GE on each single height cell SHC may be spaced apart from each other in the first direction D1. The gate electrodes GE may be arranged to form a plurality of gate groups, which are spaced apart from each other in the first direction D1, and here, each of the gate groups may be composed of a plurality of gate electrodes GE that are arranged in the second direction D2.

The gate electrode GE may extend from the top surface of the substrate 100 to a gate capping pattern GP, which will be described below, in a vertical direction (i.e., the third direction D3). The gate electrode GE may extend from the lower channel pattern LCH of the lower active region LAR to the upper channel pattern UCH of the upper active region UAR in the third direction D3. The gate electrode GE may extend from the lowermost one of the first semiconductor patterns SP1 to the uppermost one of the fourth semiconductor patterns SP4 in the third direction D3.

The gate electrode GE may be provided on a top surface, a bottom surface, and opposite side surfaces of each of the first to fourth semiconductor patterns SP1 to SP4. That is, the transistor according to the present embodiment may include a three-dimensional field effect transistor (e.g., a multibridge channel FET (MBCFET™) and/or a gate-all-around FET (GAAFET)) in which the gate electrode GE is provided to three-dimensionally surround the channel pattern.

The gate electrode GE may include a lower gate electrode LGE, which is provided in the bottom tier of the FEOL layer (i.e., the lower active region LAR), and an upper gate electrode UGE, which is provided in the top tier of the FEOL layer (e.g., the upper active region UAR). The lower gate electrode LGE and the upper gate electrode UGE may vertically overlap with each other. In various example embodiments, the lower gate electrode LGE and the upper gate electrode UGE may be connected to each other. For example, the gate electrode GE according to various example embodiments may be or may correspond to a common gate electrode, in which the lower gate electrode LGE on the lower channel pattern LCH and the upper gate electrode UGE on the upper channel pattern UCH are connected to each other.

The lower gate electrode LGE may include a first inner electrode PO1 interposed between a first active pattern AP1 and the first semiconductor pattern SP1, a second inner electrode PO2 interposed between the first semiconductor pattern SP1 and the second semiconductor pattern SP2, and a third inner electrode PO3 interposed between the second semiconductor pattern SP2 and the dummy channel pattern DSP.

The upper gate electrode UGE may include a fourth inner electrode PO4 interposed between the dummy channel pattern DSP (or the seed layer SDL) and the third semiconductor pattern SP3, a fifth inner electrode PO5 interposed between the third semiconductor pattern SP3 and the fourth semiconductor pattern SP4, and an outer electrode PO6 on the fourth semiconductor pattern SP4.

A pair of gate spacers GS may be disposed on opposite side surfaces of the gate electrode GE, respectively. The paired gate spacers GS may be disposed on opposite side surfaces of the outer electrode PO6, respectively. The gate spacers GS may extend along the gate electrode GE and in the second direction D2. Top surfaces of the gate spacers GS may be higher than or above a top surface of the gate electrode GE. The top surfaces of the gate spacers GS may be coplanar with or at a same level with a top surface of a second interlayer insulating layer 120. The gate spacers GS may be formed of or include at least one of SiCN, SiCON, or SiN. In various example embodiments, the gate spacers GS may be a multi-layered structure, which includes at least two different materials selected from SiCN, SiCON, and SiN.

The gate capping pattern GP may be provided on the top surface of the gate electrode GE. The gate capping pattern GP may extend along the gate electrode GE or in the second direction D2. For example, the gate capping pattern GP may be formed of or include at least one of SiON, SiCN, SiCON, or SiN.

A gate insulating layer GI may be interposed between the gate electrode GE and the first to fourth semiconductor patterns SP1 to SP4. The gate insulating layer GI may include a silicon oxide layer, a silicon oxynitride layer, and/or a high-k dielectric layer. The high-k dielectric layer may have a dielectric constant greater than that of silicon oxide. In various example embodiments, the gate insulating layer GI may include a silicon oxide layer, which is formed to directly cover the semiconductor patterns SP1 to SP4, and a high-k dielectric layer, which is formed on the silicon oxide layer. In some example embodiments, the gate insulating layer GI may be a multi-layered structure including the silicon oxide layer and the high-k dielectric layer.

The high-k dielectric layer may be formed of or include at least one of high-k dielectric materials whose dielectric constants are higher than that of silicon oxide. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The second interlayer insulating layer 120 may be provided on the upper source/drain pattern USD and the gate electrode GE. The second interlayer insulating layer 120 may cover the upper source/drain pattern USD. A third interlayer insulating layer 130 may be provided to cover or at least partially cover the second interlayer insulating layer 120.

Upper active contacts UAC may be provided to penetrate the second and third interlayer insulating layers 120 and 130 and may be electrically connected to the upper source/drain patterns USD, respectively. In various example embodiments, a top surface of the upper active contact UAC may be coplanar with or at a same level with a top surface of the third interlayer insulating layer 130.

An upper gate contact UGC may be provided to penetrate the third interlayer insulating layer 130 and the gate capping pattern GP and may be electrically connected to the upper gate electrode UGE. Each of the upper active contact UAC and the upper gate contact UGC may be formed of or include at least one metallic material that is selected from the group consisting of copper (Cu), aluminum (Al), ruthenium (Ru), cobalt (Co), tungsten (W), and molybdenum (Mo).

A cutting pattern CT may be provided to cross the gate groups arranged in the first direction D1. The cutting pattern CT may extend in the first direction D1. The cutting pattern CT may be provided to separate the gate electrodes GE, which are included in the gate group and are adjacent to each other in the second direction D2, from each other. The adjacent ones of the gate electrodes GE may be spaced apart from each other in the second direction D2 by the cutting pattern CT. The cutting pattern CT may be formed of or include at least one of insulating materials (e.g., silicon oxide and/or silicon nitride).

A fourth interlayer insulating layer 140 may be provided on the third interlayer insulating layer 130. A first metal layer M1 may be provided in the fourth interlayer insulating layer 140. The first metal layer M1 may include upper interconnection lines UMI. The first metal layer M1 may further include an upper via UVI. The upper via UVI may electrically connect the upper interconnection line UMI to the upper active contact UAC or the upper gate contact UGC. Each of the upper interconnection line UMI and the upper via UVI may be formed of or include at least one metallic material that is selected from the group consisting of copper (Cu), aluminum (Al), ruthenium (Ru), cobalt (Co), tungsten (W), and molybdenum (Mo).

Additional metal layers (e.g., M2, M3, M4, and so forth (not illustrated)) may be stacked on the first metal layer M1. The first metal layer M1 and the additional metal layers (e.g., M2, M3, M4, and so forth) thereon may constitute or correspond to a back-end-of-line (BEOL) layer of the semiconductor device. The additional metal layers (e.g., M2, M3, M4, and so forth) on the first metal layer M1 may include routing lines, which are used to connect the logic cells to each other.

A lower interlayer insulating layer 210 may be provided below the bottom surface of the substrate 100. A lower gate contact LGC, which is electrically connected to the lower gate electrode LGE, may be provided between the lower interlayer insulating layer 210 and the lower gate electrode LGE. A back-side metal layer BSM may be provided in the lower interlayer insulating layer 210. The back-side metal layer BSM may include a lower contact LC, lower interconnection lines LMI, and a lower via LVI. The lower contact LC may be electrically connected to the lower source/drain pattern LSD through the lower active contact LAC. The lower via LVI may electrically connect the lower interconnection line LMI to the lower active contact LAC, the lower contact LC, or the lower gate contact LGC.

Each of the lower gate contact LGC, the lower contact LC, the lower interconnection line LMI and the lower via LVI may independently or concurrently be formed of or include a metallic material that is selected from the group consisting of copper (Cu), aluminum (Al), ruthenium (Ru), cobalt (Co), tungsten (W), and molybdenum (Mo).

Lower metal layers may be further stacked below the back-side metal layer BSM. In various example embodiments, the lower metal layers may include a power delivery network. The power delivery network may include a wiring network, which is used to apply the source and drain voltages VSS and VDD to the back-side metal layer BSM.

A penetration via THV may be provided in the cutting pattern CT. The penetration via THV may be used to electrically connect the lower and upper source/drain patterns LSD and USD, which are vertically stacked, to each other. In detail, the penetration via THV may be electrically connected to the upper source/drain pattern USD through the upper active contact UAC and may be electrically connected to the lower source/drain pattern LSD through the lower contact LC and the lower active contact LAC. The penetration via THV may be formed of or include at least one metallic material that is selected from the group consisting of copper (Cu), aluminum (Al), ruthenium (Ru), cobalt (Co), tungsten (W), and molybdenum (Mo).

A wide via WV may be provided in the cutting pattern CT. The wide via WV may extend from a top surface of the cutting pattern CT to a bottom surface of the cutting pattern CT and may extend in the first direction D1 when viewed in a plan view. The wide via WV may have an 'L'-shaped profile, when viewed in a sectional view. The wide via WV may be formed of or include at least one of metallic materials (e.g., copper (Cu), aluminum (Al), ruthenium (Ru), cobalt (Co), tungsten (W), and molybdenum (Mo)).

A top surface WV*a* of the wide via WV may include a first top surface W1*a* and a second top surface W2*a*, which is located at a level lower than the first top surface W1*a*. The first top surface W1*a* may be a top surface of a first via portion W1 of the wide via WV, and the second top surface W2*a* may be a top surface of a second via portion W2 of the wide via WV. The first and second via portions W1 and W2 may be adjacent to each other in the first direction D1. In various example embodiments, the second top surface W2*a* may be located at a level lower than the top surface of the upper active contact UAC.

A bottom surface WV*b* of the wide via WV may be substantially flat. In various example embodiments, the first via portion W1 and the second via portion W2 may have a first bottom surface W1*b* and a second bottom surface W2*b*, respectively, which are located at substantially the same level. Thus, when measured in a vertical direction (e.g., the third direction D3), a height HT2 of the second via portion W2 may be larger than a height HT1 of the first via portion W1. In various example embodiments, the height HT2 of the second via portion W2 may range from 20% to 80% of the height HT1 of the first via portion W1; example embodiments are not limited thereto.

A lower portion of the wide via WV may protrude in the first direction D1, compared with an upper portion thereof. The lower portion of the wide via WV may be a portion, which is placed below the second top surface W2*a* of the wide via WV, and the upper portion of the wide via WV may be a portion, which is placed above the second top surface W2*a*. The lower portion of the wide via WV may include a lower portion of the first via portion W1 and the second via portion W2, and the upper portion of the wide via WV may include an upper portion of the first via portion W1. In the wide via WV, a width of the lower portion may be larger than that of the upper portion, when measured in the first direction D1.

When viewed in a sectional view, the wide via WV may have a first side surface WV*c* that is oriented in the first direction D1. The first side surface WV*c* of the wide via WV may include a first sub-side surface W1*c*, which is a side surface of an upper portion of the wide via WV (i.e., a side surface of the first via portion W1), and a second sub-side surface W2*c*, which is a side surface of a lower portion of the wide via WV (i.e., a side surface of the second via portion W2). The second sub-side surface W2*c* may be offset from the first sub-side surface W1*c* in the first direction D1. Thus, the first side surface WV*c* of the wide via WV may discontinuously extend in the third direction D3. In various example embodiments, the first sub-side surface W1*c*, the second top surface W2*a*, and the second sub-side surface W2*c* of the wide via WV may be connected to each other to form a stepwise profile.

The wide via WV may have a second side surface WV*d*, which is opposite to the first side surface WV*c*. The second side surface WV*d* may include opposite side surfaces of the upper and lower portions of the wide via WV (e.g., an opposite side surface of the first via portion W1). The second side surface WV*d* of the wide via WV may continuously extend in the third direction D3. In various example embodiments, the second side surface WV*d* of the wide via WV may be linearly extended in the third direction D3.

The wide via WV may electrically connect the lower source/drain pattern LSD and the upper source/drain pattern USD, which are horizontally spaced apart from each other. In detail, the lower source/drain pattern LSD may include a first lower source/drain pattern LSD1 and a second lower source/drain pattern LSD2, which are spaced apart from each other in the first direction D1, and the upper source/drain pattern USD may include a first upper source/drain pattern USD1 and a second upper source/drain pattern USD2, which are spaced apart from each other in the first direction D1. The first upper source/drain pattern USD1 may be vertically stacked on the first lower source/drain pattern LSD1, and the second upper source/drain pattern USD2 may be vertically stacked on the second lower source/drain pattern LSD2. A first lower active contact LAC1 and a first lower contact LC1 may be sequentially and electrically connected to the first lower source/drain pattern LSD1, and a first upper active contact UAC1 may be electrically connected to the first upper source/drain pattern USD1. A second lower active contact LAC2 and a second lower contact LC2 may be sequentially and electrically connected to the second lower source/drain pattern LSD2, and a second upper active contact UAC2 may be electrically connected to the second upper source/drain pattern USD2.

The wide via WV may electrically connect the first upper source/drain pattern USD1 to the second lower source/drain pattern LSD2. In detail, the wide via WV may be electrically connected to the first upper source/drain pattern USD1 through the first upper active contact UAC1 and may be electrically connected to the second lower source/drain pattern LSD2 through the second lower contact LC2 and the second lower active contact LAC2. The wide via WV may be spaced apart from and electrically disconnected from the second upper active contact UAC2 and the first lower contact LC1. In various example embodiments, the second via portion W2 of the wide via WV may be spaced apart from the second upper active contact UAC2, when measured in the second and third directions D2 and D3. Thus, the wide via WV may be electrically disconnected from the second upper source/drain pattern USD2 and the first lower source/drain pattern LSD1, respectively.

In various example embodiments, the first upper active contact UAC1 may vertically overlap with the first via portion W1 of the wide via WV, and the second via portion W2 of the wide via WV may vertically overlap with the second lower contact LC2. The first via portion W1 of the wide via WV may not vertically overlap with the first lower contact LC1, and the second upper active contact UAC2 may not be vertically overlapped with the second via portion W2 of the wide via WV.

A third upper source/drain pattern USD3 and a third lower source/drain pattern LSD3 may be spaced apart from the second upper source/drain pattern USD2 and the second lower source/drain pattern LSD2, with the wide via WV interposed therebetween. A third lower active contact LAC3 and a third lower contact LC3 may be sequentially and electrically connected to the third lower source/drain pattern LSD3, and a third upper active contact UAC3 may be electrically connected to the third upper source/drain pattern USD3. The wide via WV may be (e.g., horizontally) spaced apart from and electrically disconnected from the third upper active contact UAC3 and the third lower contact LC3. Thus, the wide via WV may be electrically disconnected from the third upper source/drain pattern USD3 and the third lower source/drain pattern LSD3, respectively.

The gate electrode GE may be interposed between the first and second upper source/drain patterns USD1 and USD2 and between the first and second lower source/drain patterns LSD1 and LSD2. The wide via WV may be spaced apart from the gate electrode GE in the second direction D2. When viewed in a plan view, the wide via WV may extend in the first direction D1 and an opposite direction thereof, compared with the gate electrode GE.

The gate electrodes GE, which are adjacent to each other in the second direction D2, may constitute a first gate group G1, and the wide via WV may be provided to cross the first gate group G1. In various example embodiments, the second via portion W2 of the wide via WV may extend in the first direction D1 to cross the first gate group G1.

When measured in the first direction D1, a width L1 of the wide via WV may be greater than a width L3 of the gate electrode GE. Thus, the wide via WV may cross the first gate group G1 and may be electrically connected to the first upper active contact UAC1 and the second lower contact LC2. When measured in the first direction D1, the width L1 of the wide via WV may be equal to or different from a pitch L2 of the gate electrode GE. In various example embodiments, when measured in the first direction D1, the width L1 of the wide via WV may be greater than the pitch L2 of the gate electrode GE.

The cutting pattern CT may include a first cutting portion C1, which is provided to enclose the wide via WV, and a second cutting portion C2, which is provided to cover at least a portion of the top surface WV*a* of the wide via WV. In various example embodiments, the first and second cutting portions C1 and C2 may be distinct from each other with an interface therebetween or may be connected to each other without an interface therebetween. In various example embodiments, the second cutting portion C2 may cover the second top surface W2*a* of the wide via WV, and the first cutting portion C1 may enclose the wide via WV and the second cutting portion C2. The first cutting portion C1 may separate the wide via WV from the first gate group G1. The second cutting portion C2 may be vertically overlapped with the second via portion W2. Accordingly, an upper portion of the cutting pattern CT including the second cutting portion C2 may be vertically overlapped with the lower portion of the wide via WV. A top surface of the cutting pattern CT and the first top surface W1*a* of the wide via WV may be located at substantially the same level and may be coplanar with each other.

According to various example embodiments, in a region adjacent to the second upper active contact UAC2, the wide via WV may be recessed to have the second top surface W2*a*, which is located at a relatively low level. Accordingly, it may be possible to increase a distance between the wide via WV and the second upper active contact UAC2, and thus, a short circuit may be prevented from or reduced in likelihood of being formed between the wide via WV and the second upper active contact UAC2. Thus, it may be possible to improve the electrical and/or reliability characteristics of the three-dimensional semiconductor device.

Alternatively or additionally, since the wide via WV is used to electrically connect the lower and upper source/drain patterns LSD and USD (e.g., the second lower source/drain pattern LSD2 and the first upper source/drain pattern USD1), which are horizontally spaced apart from each other, it may be possible to improve a degree of freedom in designing the three-dimensional semiconductor device.

Hereinafter, various example embodiments will be described in more detail with reference to FIGS. 6 to 9B. For concise description, a previously described element may be identified by the same reference number without repeating an overlapping description thereof.

Figure 6:
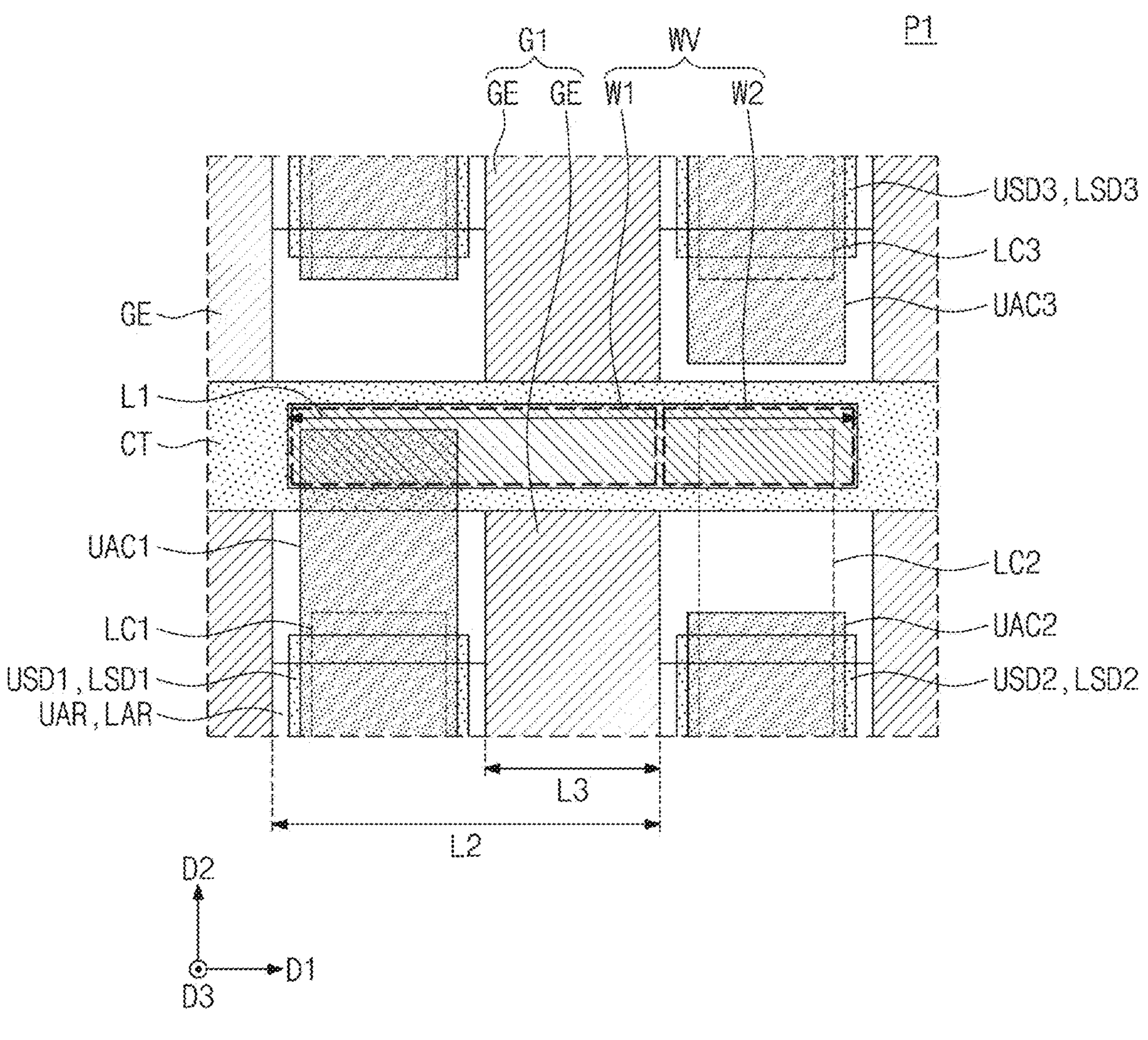
FIG. 6 is an enlarged plan view illustrating the portion 'P1' of FIG. 3.
Figure 7A:
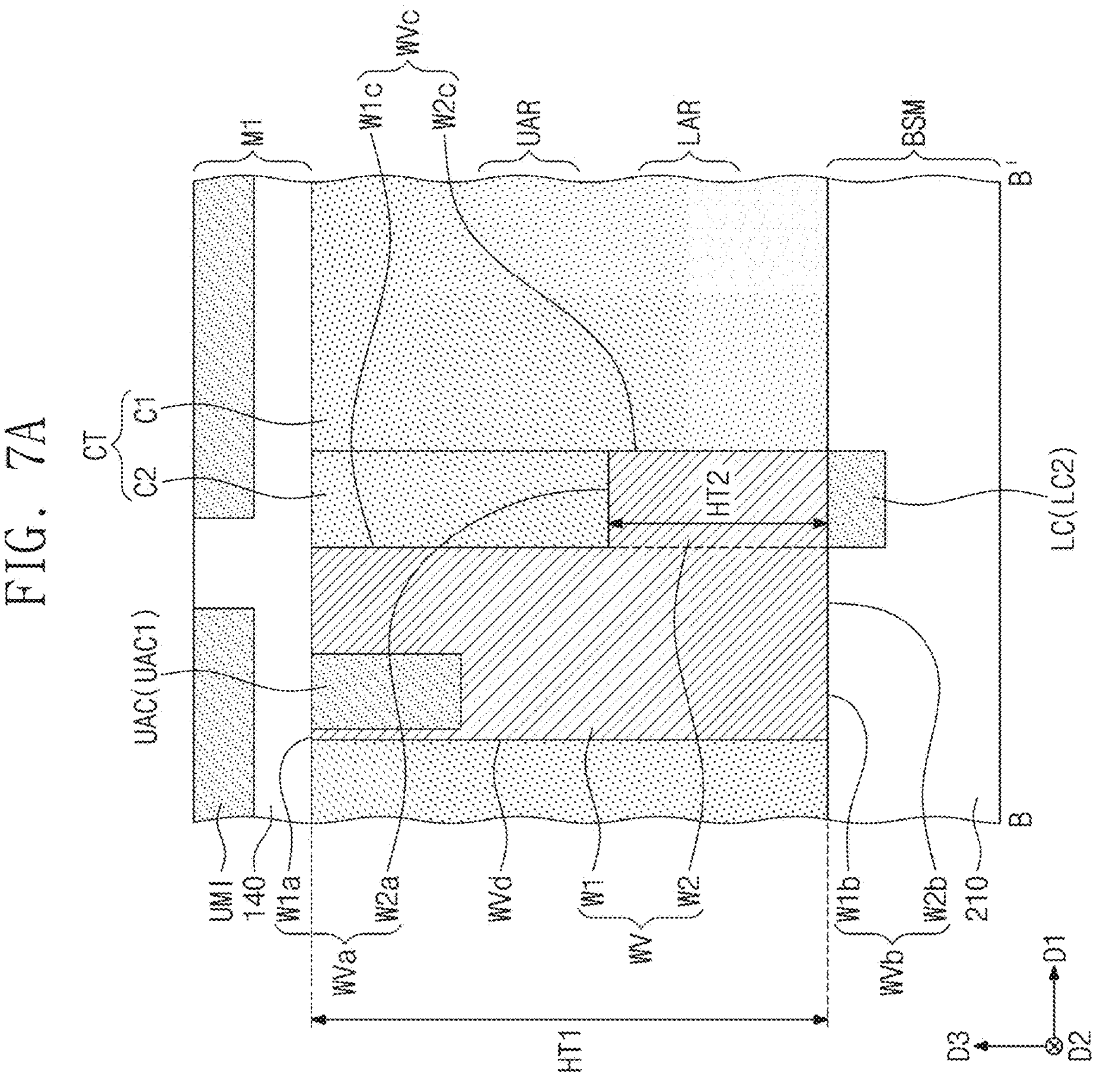
Figure 7B:
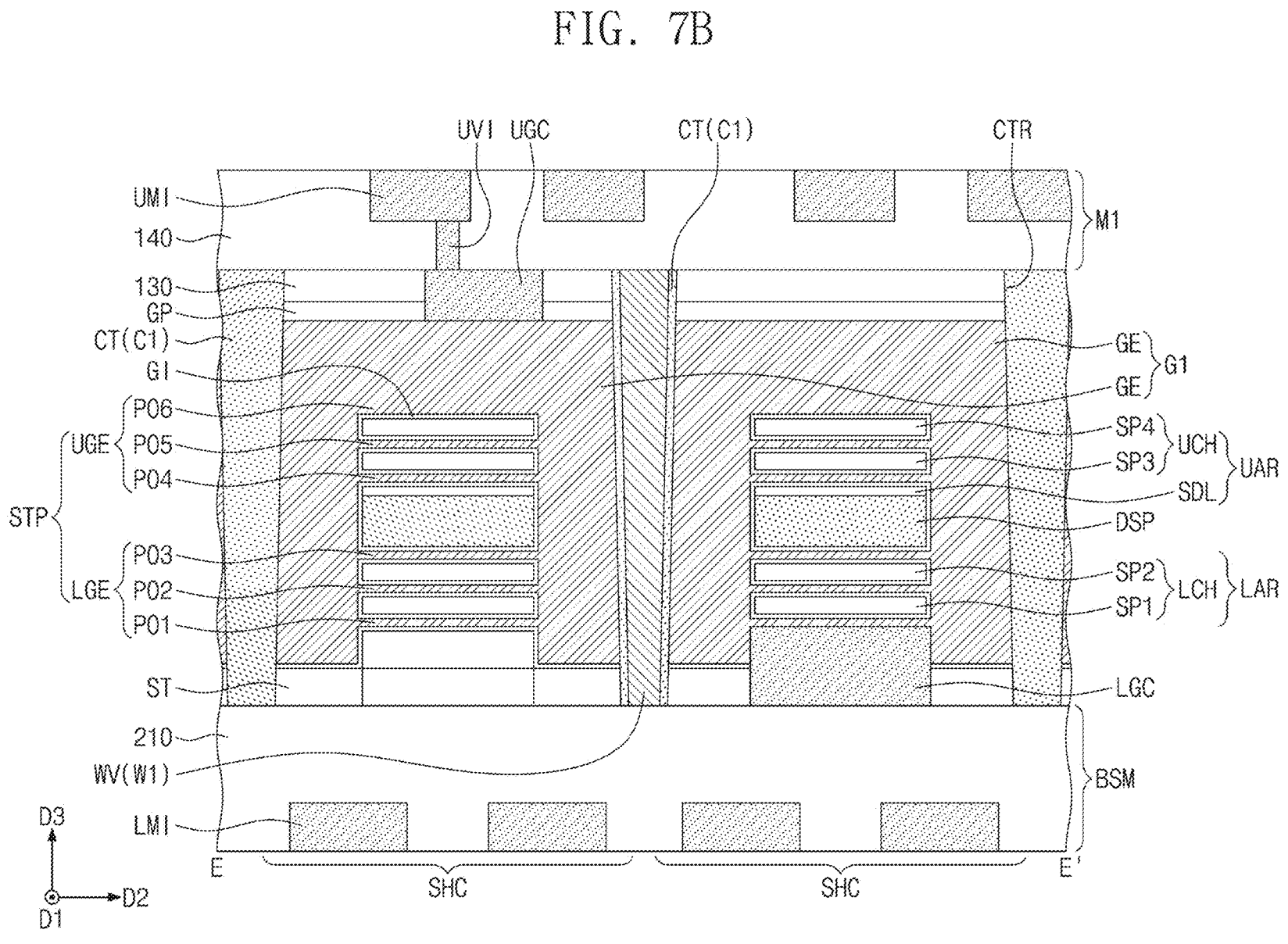

FIG. 6 is an enlarged plan view illustrating the portion 'P1' of FIG. 3. FIGS. 7A and 7B are sectional views taken along lines B-B' and E-E', respectively, of FIG. 3.

Referring to FIGS. 3 and 6 to 7B, the wide via WV may be provided to cross the first gate group G1. In various example embodiments, the first via portion W1 of the wide via WV may extend in the first direction D1, between the gate electrodes GE of the first gate group G1, unlike that described with reference to FIGS. 4 to 5E. The first via portion W1 may be spaced apart from the first gate group G1 in the second direction D2, with the cutting pattern CT interposed therebetween.

Figure 8:
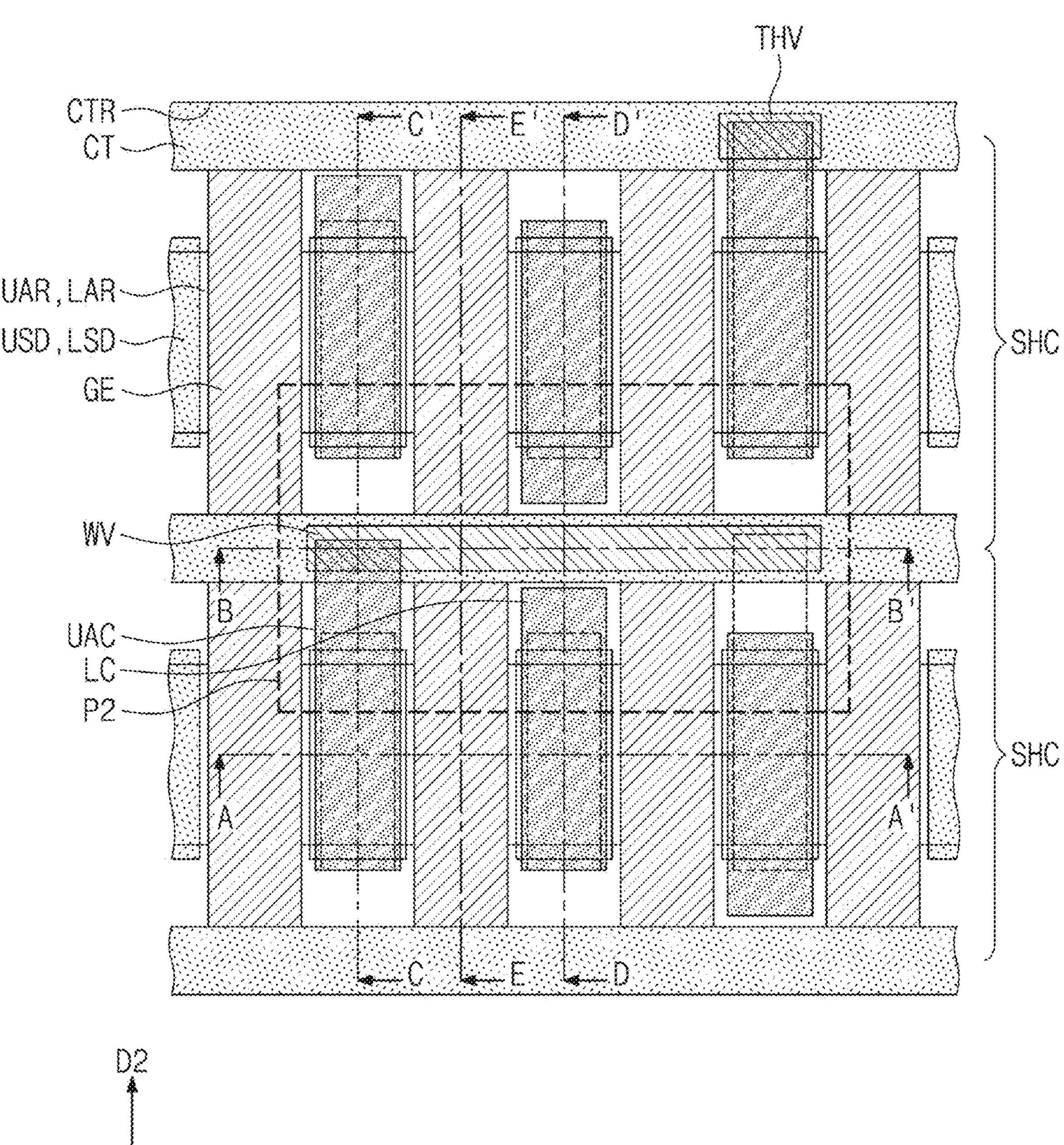
FIG. 8 is a plan view illustrating a three-dimensional semiconductor device according to various example embodiments.
Figure 9B:
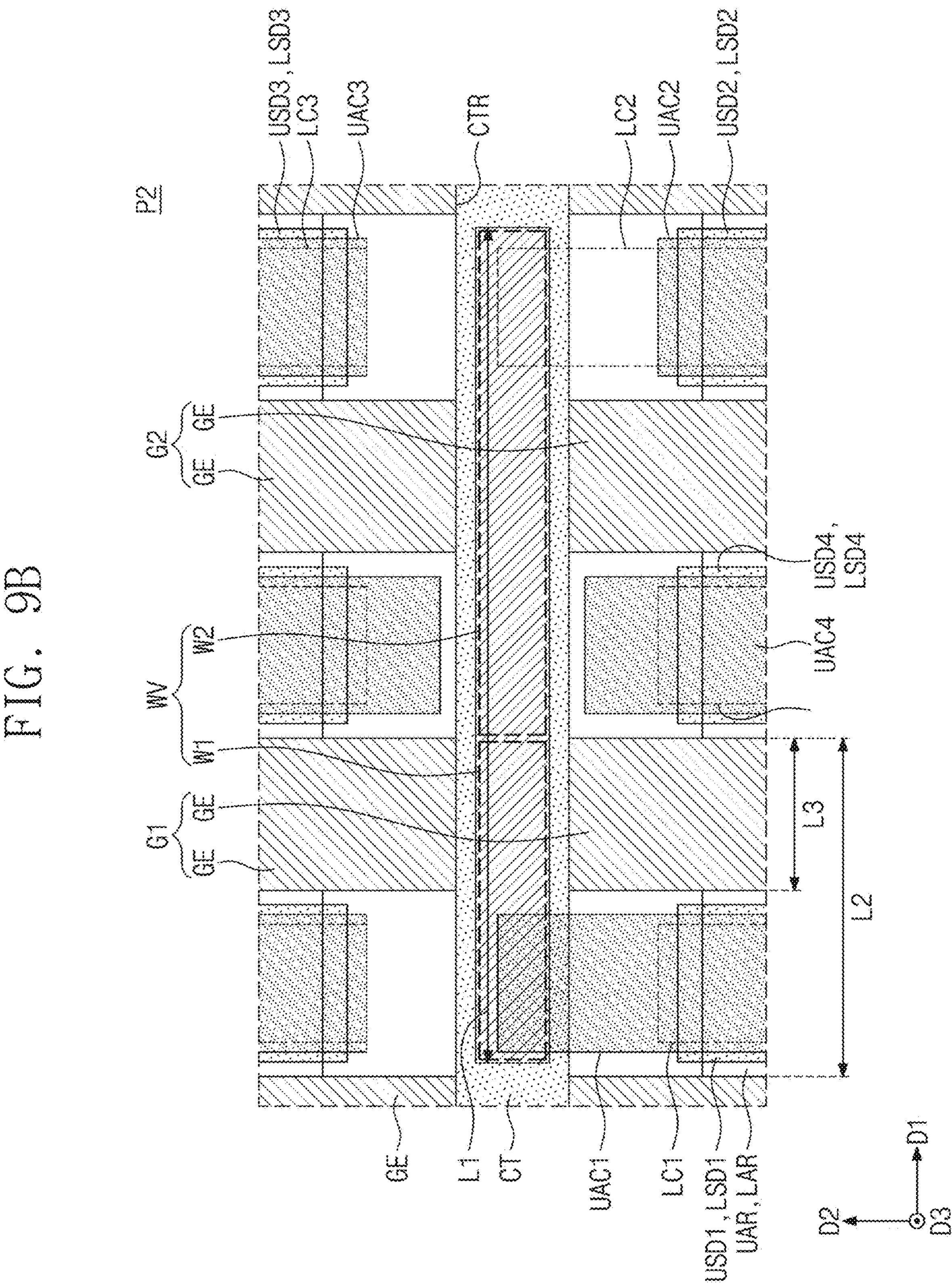

FIG. 8 is a plan view illustrating a three-dimensional semiconductor device according to various example embodiments. FIGS. 9A and 9B are enlarged plan views illustrating a portion 'P2' of FIG. 8.

Referring to FIGS. 3 and 8 to 9A, a fourth lower source/drain pattern LSD4 may be provided between the first and second lower source/drain patterns LSD1 and LSD2, and a fourth upper source/drain pattern USD4 may be provided between the first and second upper source/drain patterns USD1 and USD2. A fourth lower active contact (not shown) and a fourth lower contact LC4 may be sequentially and electrically connected to the fourth lower source/drain pattern LSD4, and a fourth upper active contact UAC4 may be electrically connected to the fourth upper source/drain pattern USD4.

The first gate group G1 may be disposed between the first and fourth lower source/drain patterns LSD1 and LSD4 and between the first and fourth upper source/drain patterns USD1 and USD4. A second gate group G2 may be disposed between the second and fourth lower source/drain patterns LSD2 and LSD4 and between the second and fourth upper source/drain patterns USD2 and USD4. The fourth lower and upper source/drain patterns LSD4 and USD4 may be disposed between the first and second gate groups G1 and G2.

The wide via WV may be spaced apart from the fourth lower and upper source/drain patterns LSD4 and USD4 in the second direction D2. The wide via WV may be spaced apart from and electrically disconnected from the fourth upper active contact UAC4 and the fourth lower contact LC4 in the second direction D2. The wide via WV may be provided to cross two or more gate groups and may be electrically connected to the first upper active contact UAC1 and the second lower contact LC2. In various example embodiments, the wide via WV may be provided to cross the first gate group G1 and the second gate group G2 and may be electrically connected to the first upper active contact UAC1 and the second lower contact LC2. Accordingly, the wide via WV may electrically connect the lower and upper source/drain patterns LSD and USD, which are horizontally spaced apart from each other with two or more gate groups interposed therebetween, to each other.

The disposition or arrangement of the first and second via portions W1 and W2 of the wide via WV may be variously changed. However, the second via portion W2 may be disposed adjacent to the second lower and upper source/drain patterns LSD2 and USD2, compared with the first via portion W1.

In various example embodiments, as shown in FIG. 9A, the second via portion W2 may extend in the first direction D1, between the first and second gate groups G1 and G2, and may be spaced apart from the first and second gate groups G1 and G2 and the fourth lower and upper source/drain patterns LSD4 and USD4 in the second direction D2. The first via portion W1 may be spaced apart from the first lower an upper source/drain patterns LSD1 and USD1 in the second direction D2 and may extend toward the second via portion W2 in the first direction D1.

In various example embodiments, as shown in FIG. 9B, the first via portion W1 may extend in the first direction D1, between the first gate groups G1, and may be spaced apart from the first gate groups G1 in the second direction D2. The second via portion W2 may extend in the first direction D1, between the second gate groups G2, and may be spaced apart from the second gate groups G2 and the fourth lower and upper source/drain patterns LSD4 and USD4 in the second direction D2.

FIGS. 9A to 9B illustrate an example of possible arrangements of the first and second via portions W1 and W2, and the inventive concept is not limited to this example.

FIGS. 10A to 15D are sectional views illustrating a method of fabricating a three-dimensional semiconductor device, according to various example embodiments. In detail, FIGS. 10A, 11A, 12A, and 13A are sectional views taken, each of which is taken along a line A-A' of FIG. 3. FIGS. 10B, 11B, 12B, 13B, 14A, and 15A are sectional views, each of which is taken along a line B-B' of FIG. 3. FIGS. 10C, 11C, 12C, 13C, 14B, and 15B are sectional views, each of which is taken along a line C-C' of FIG. 3. FIG. 15C is a sectional view taken along a line D-D' of FIG. 3. FIGS. 11D, 12D, 13D, 14C, and 15D are sectional views, each of which is taken along a line E-E' of FIG. 3.

Hereinafter, a method of fabricating a three-dimensional semiconductor device according to various example embodiments will be described in more detail with reference to FIGS. 10A to 15D. For concise description, a previously described element may be identified by the same reference number without repeating an overlapping description thereof.

Figure 10A:
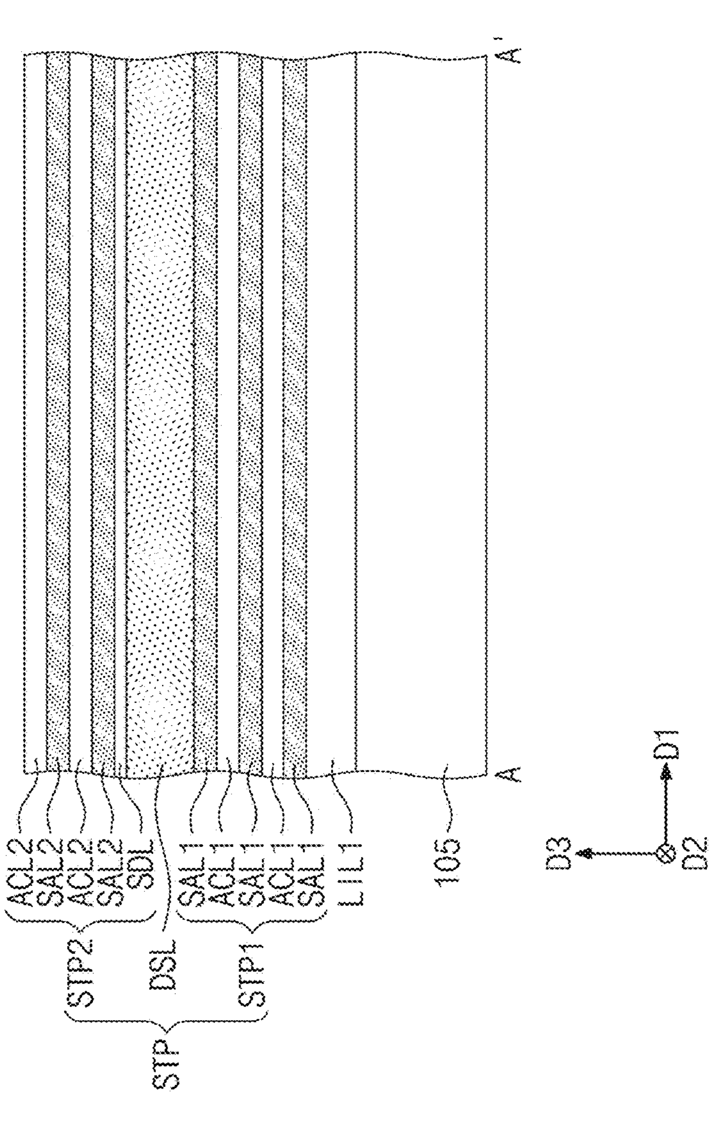
Figure 10B:
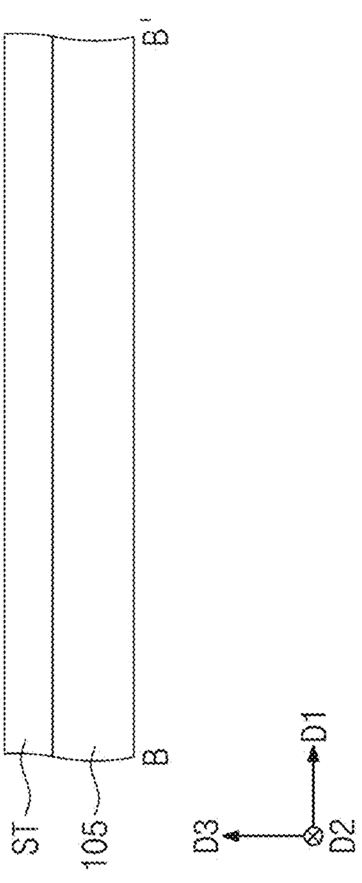
Figure 10C:
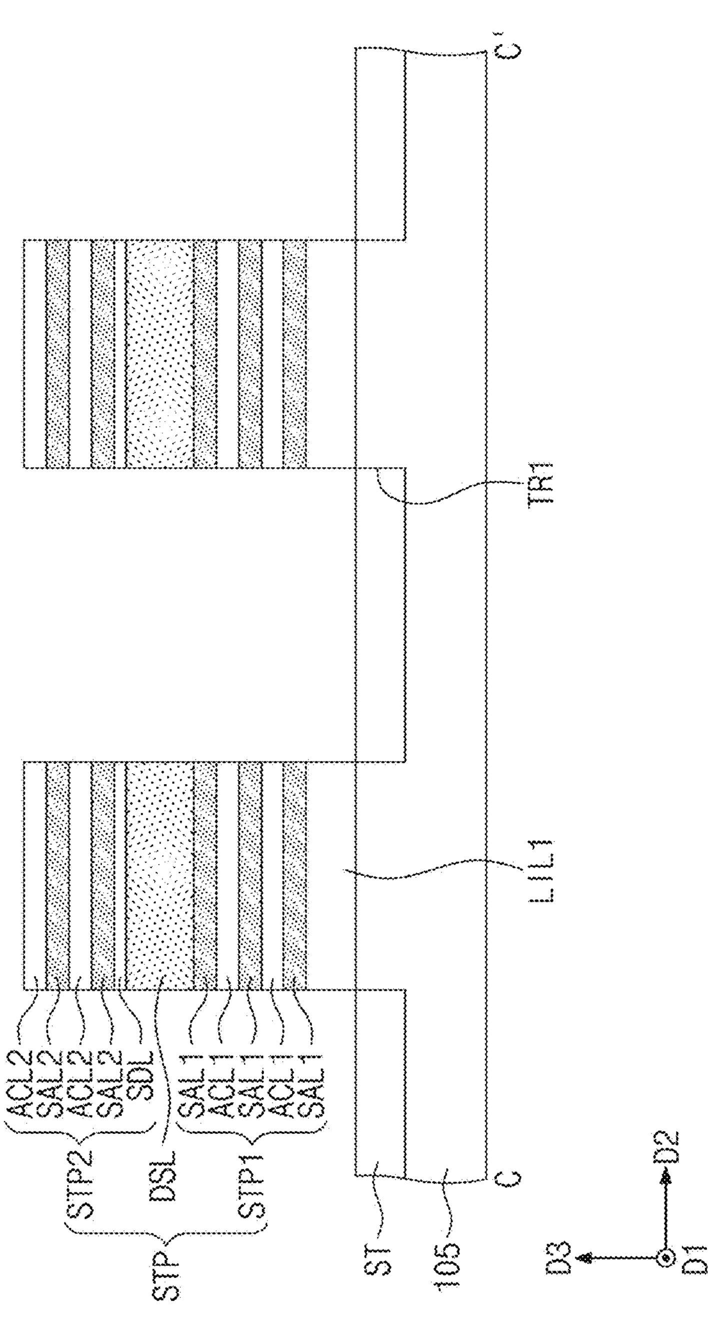
Figure 11A:
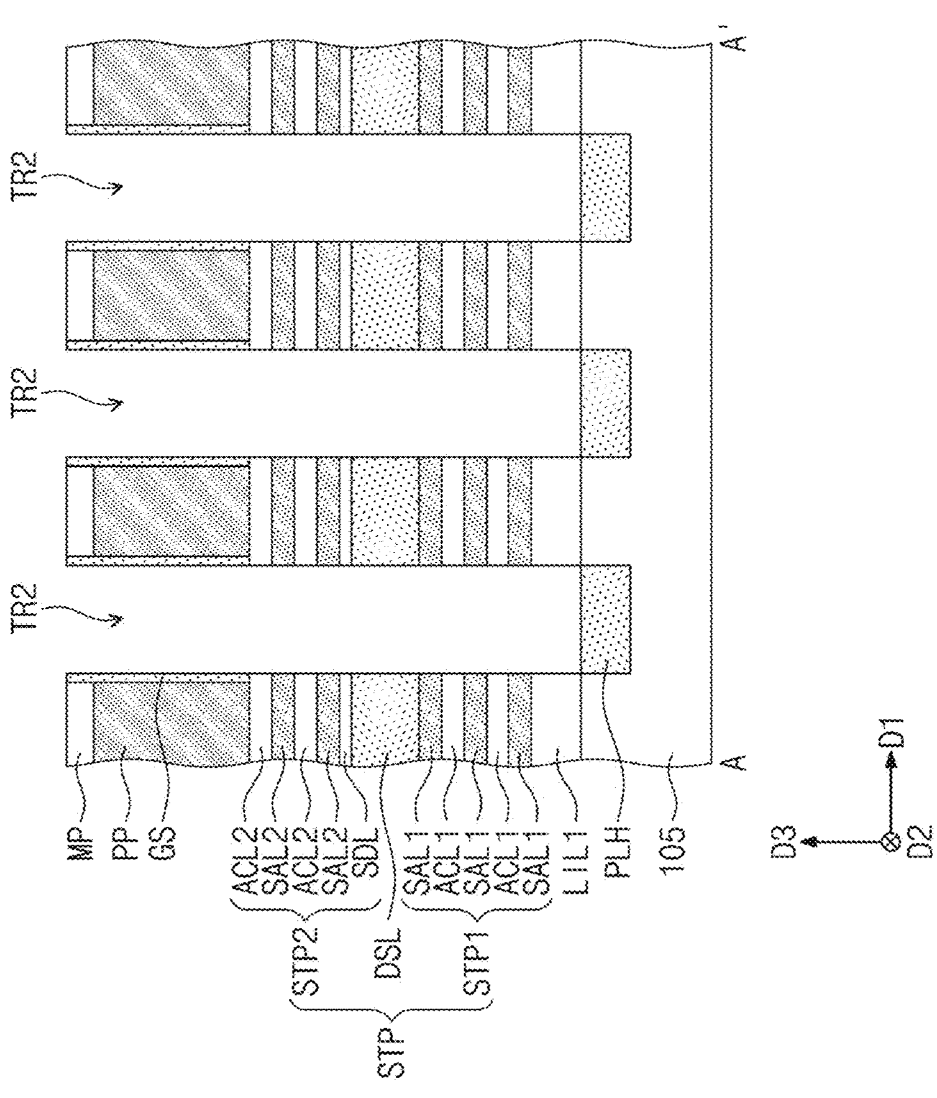
Figure 11B:
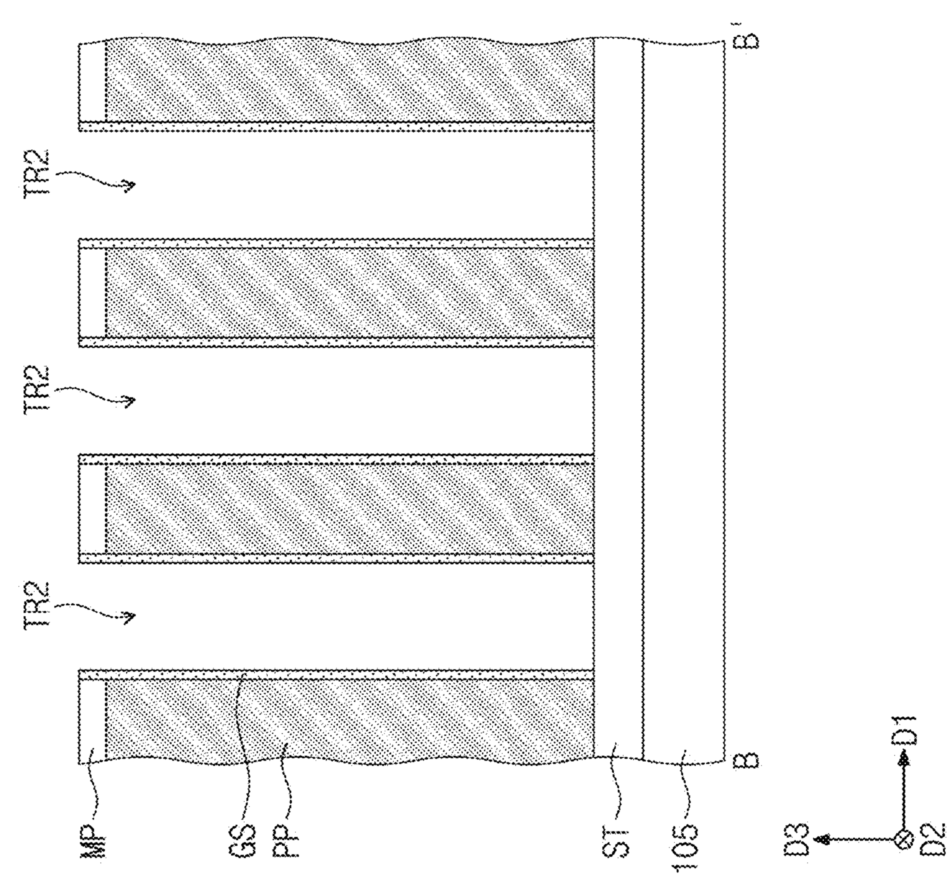
Figure 11C:
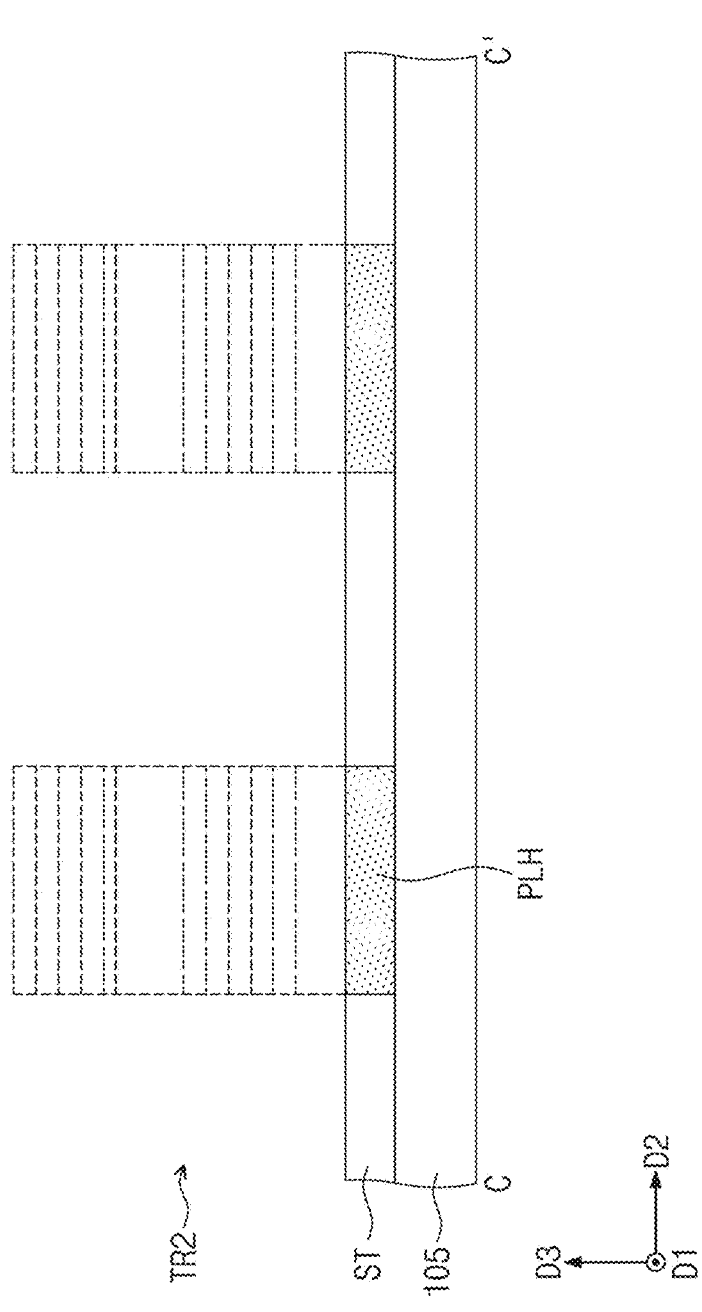
Figure 11D:
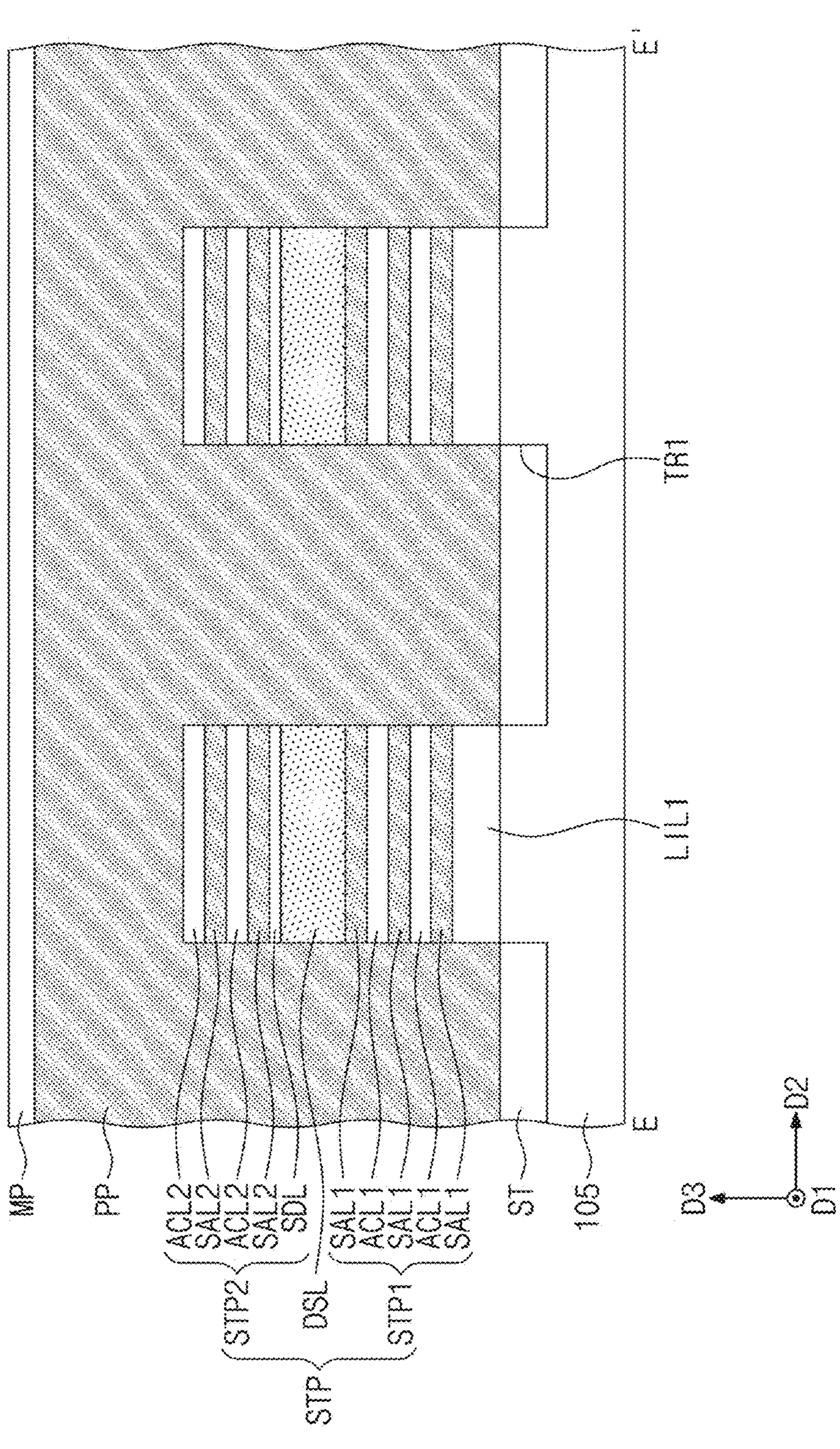
Figure 12A:
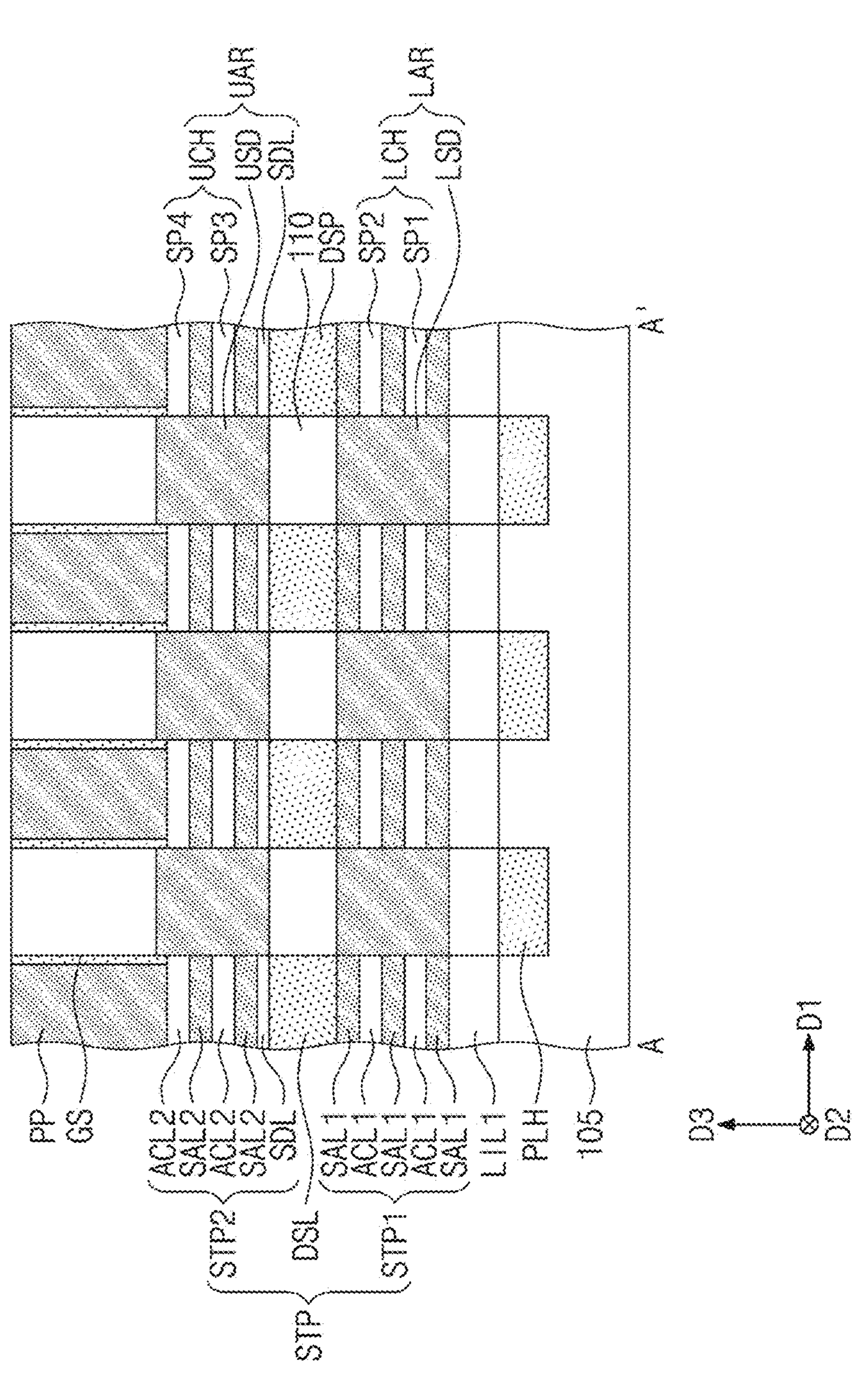
Figure 12B:
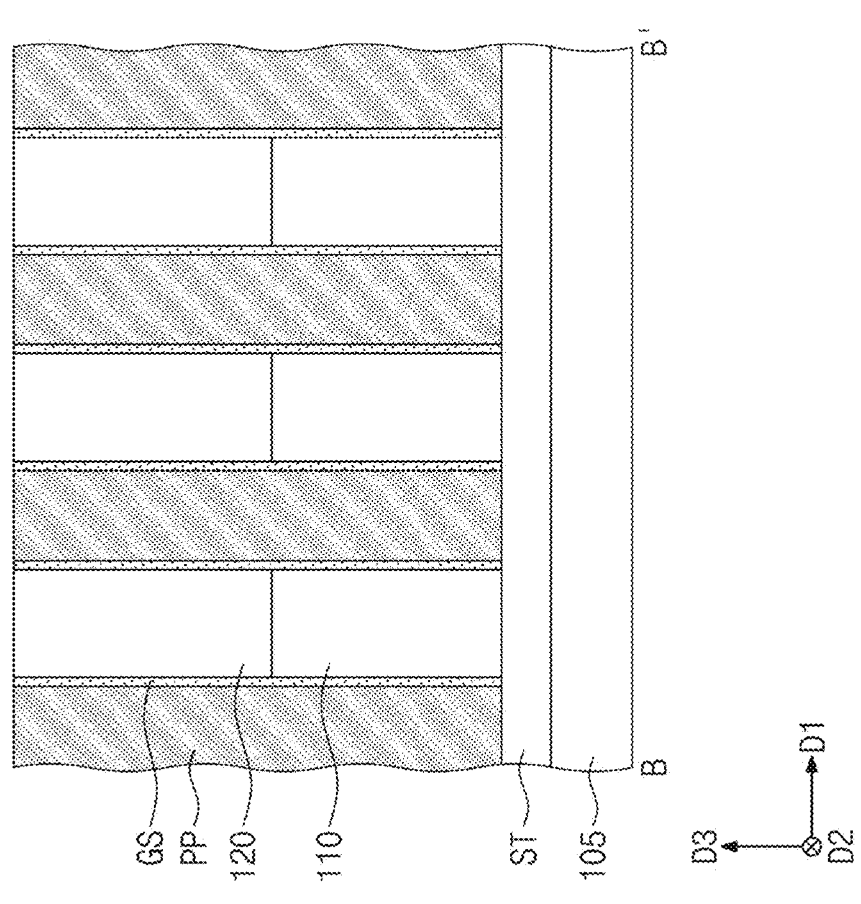
Figure 12C:
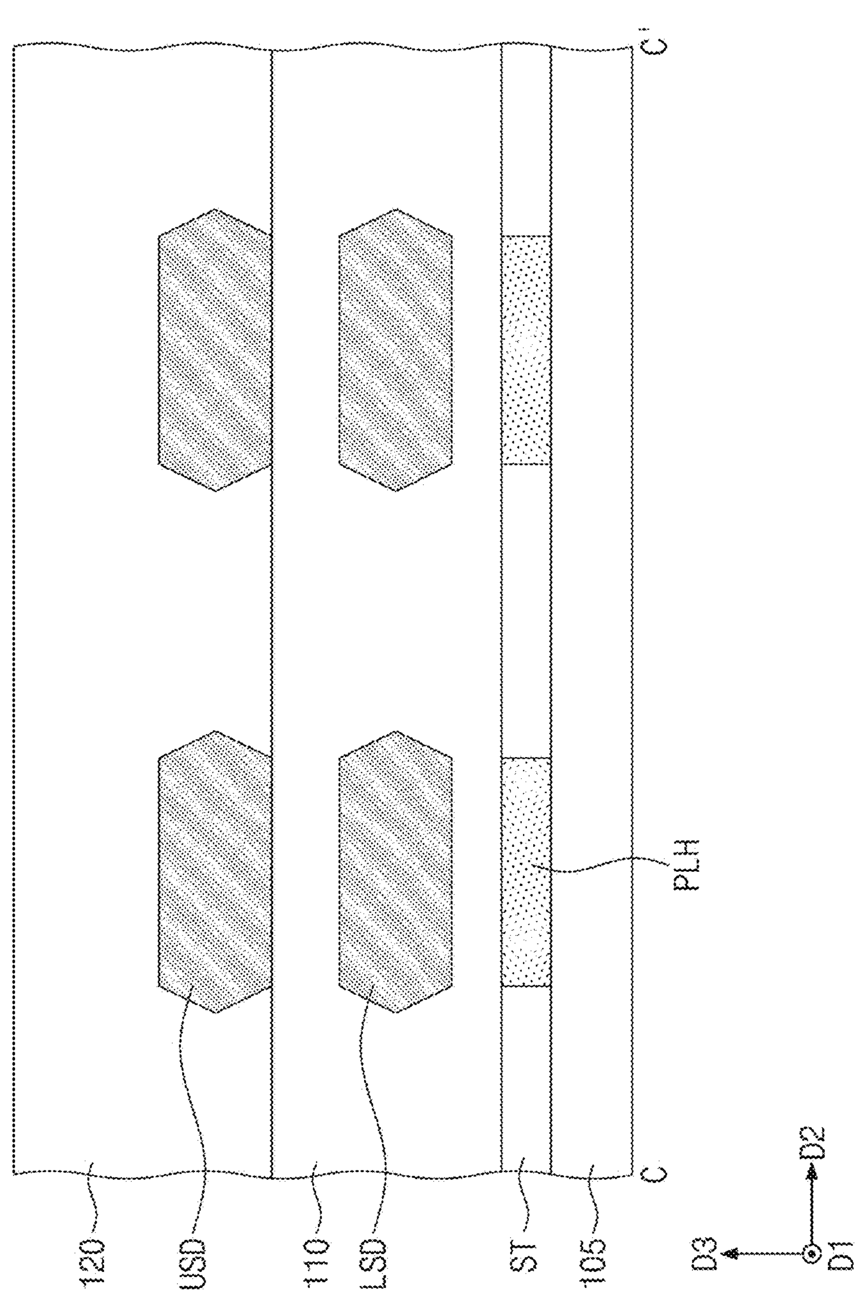
Figure 12D:
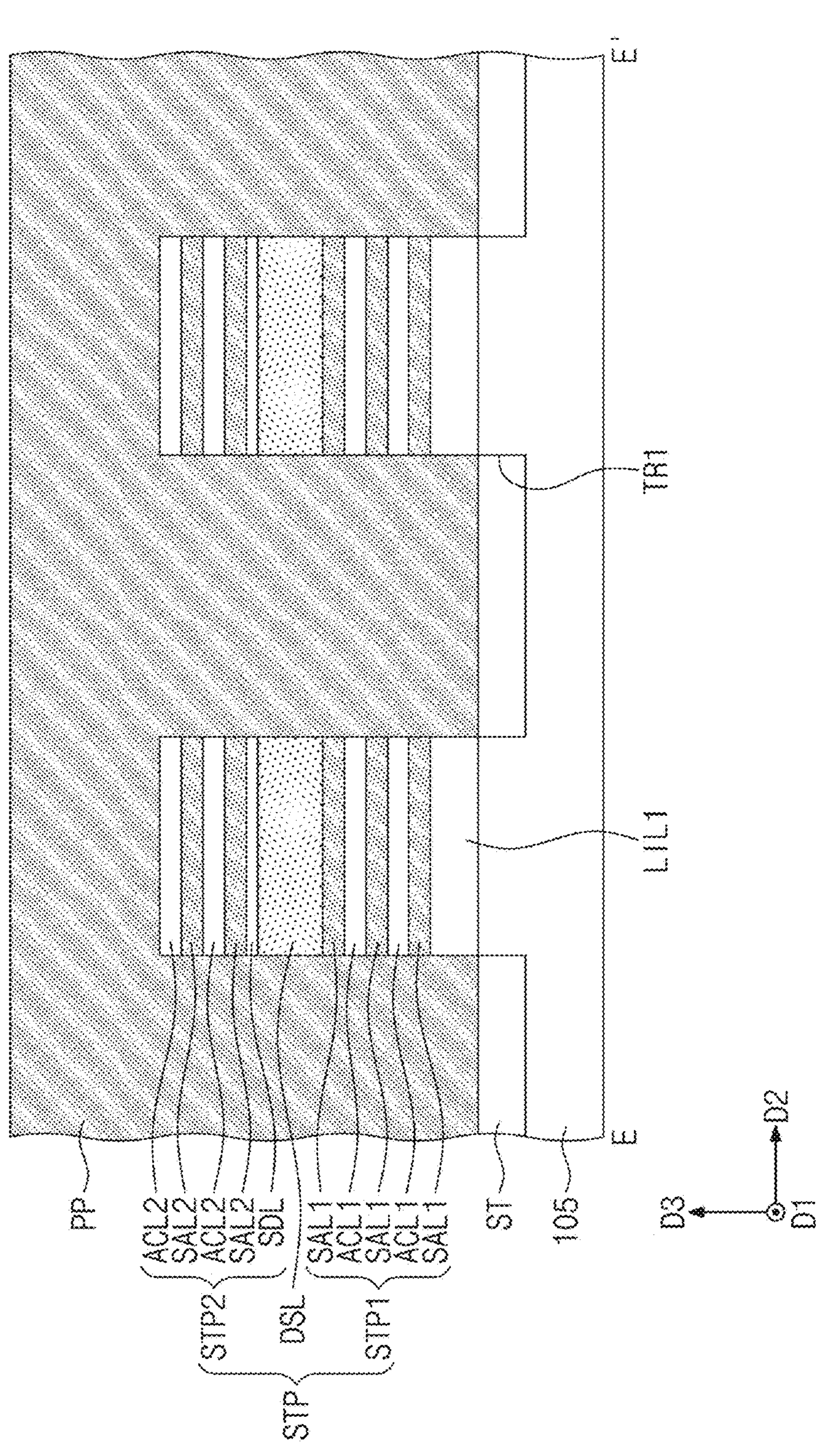
Figure 13A:
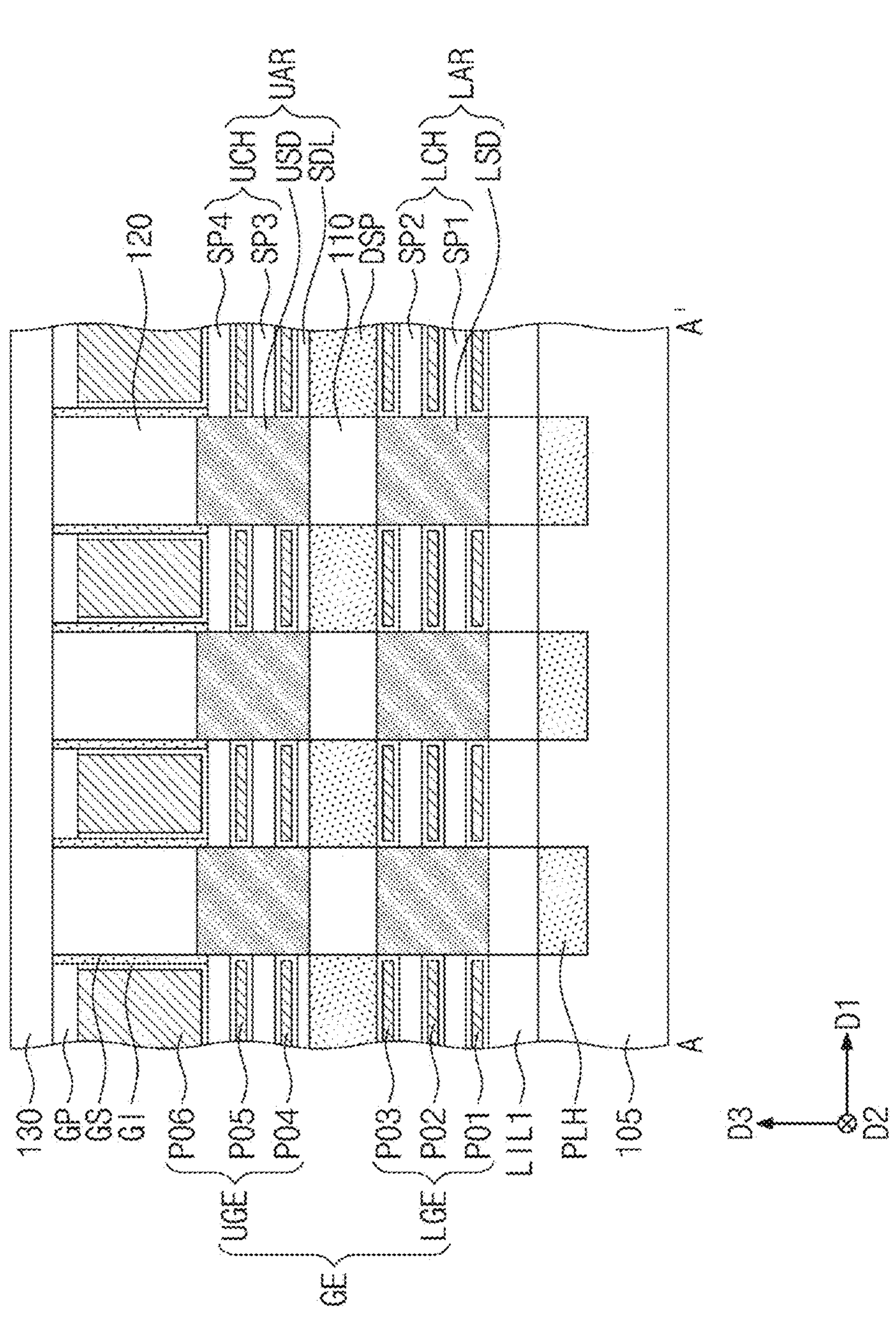
Figure 13B:
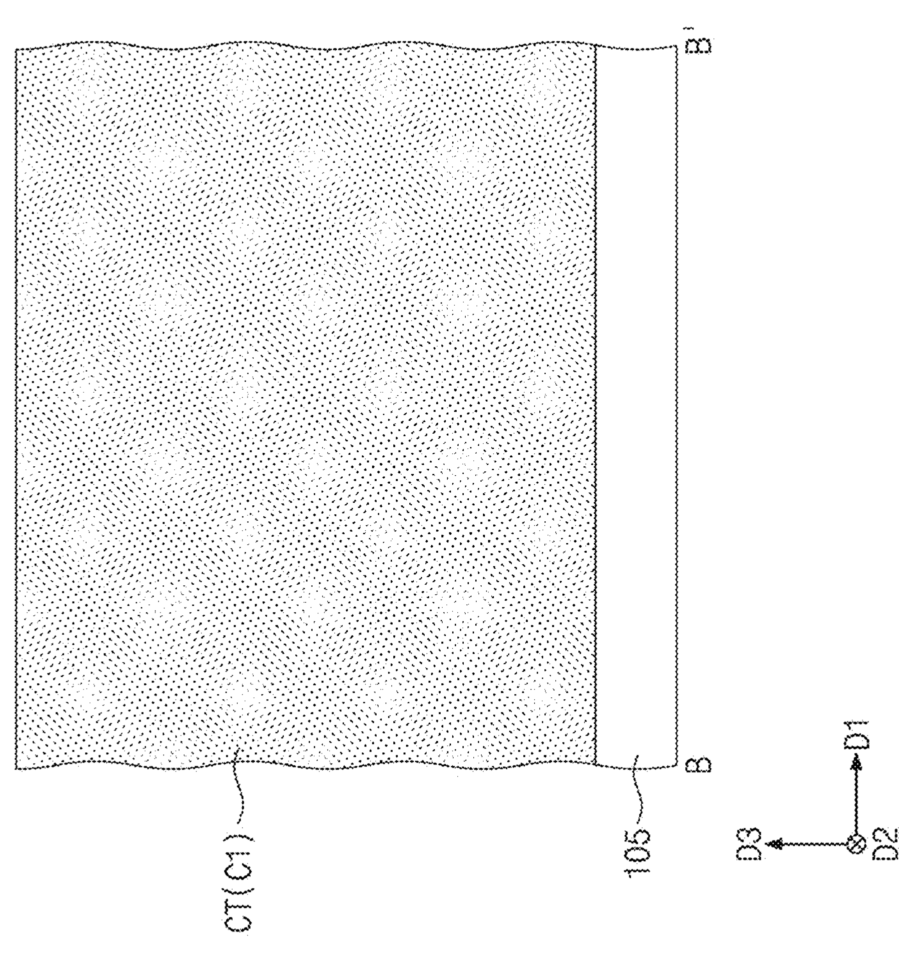
Figure 13C:
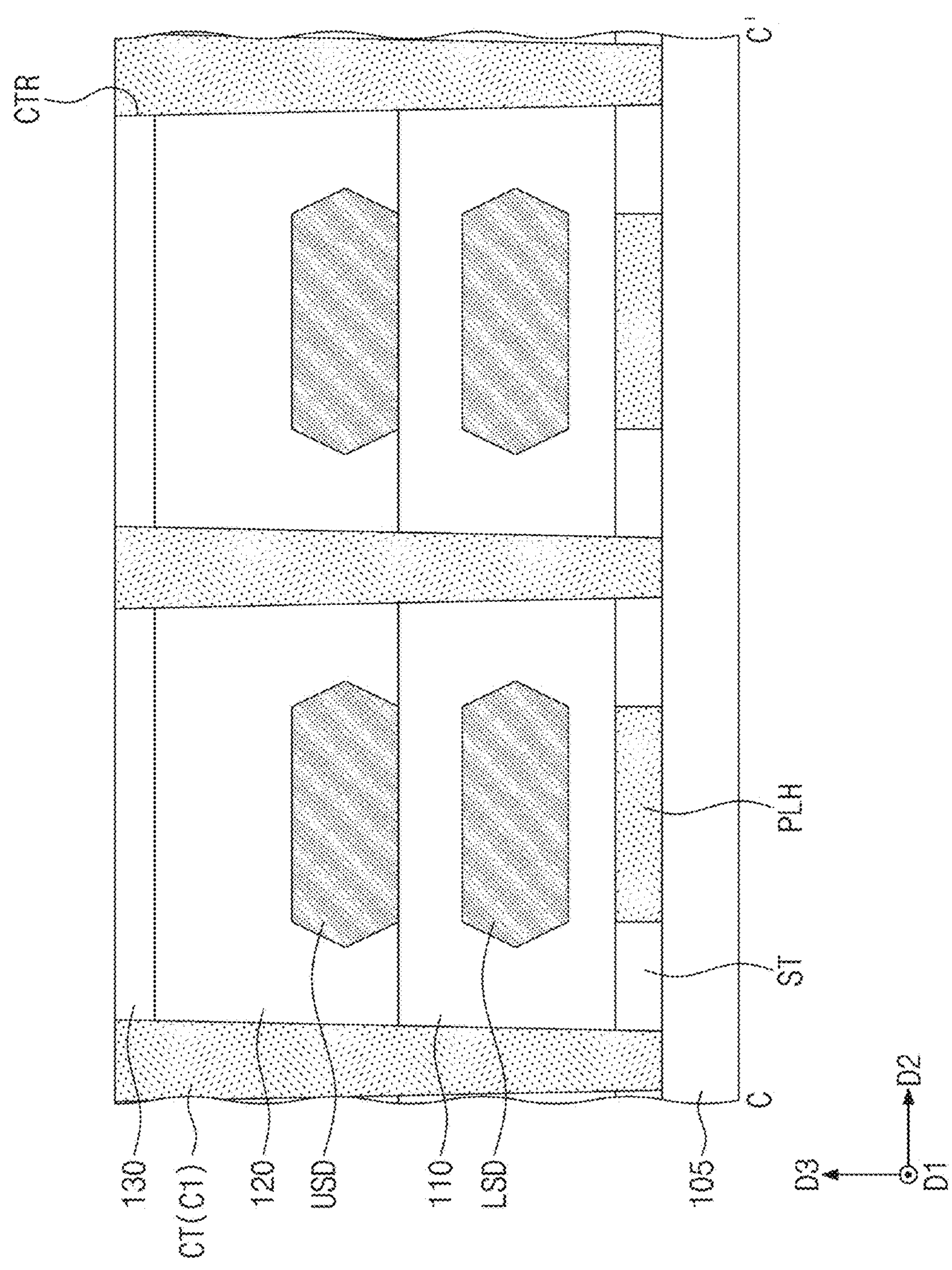
Figure 13D:
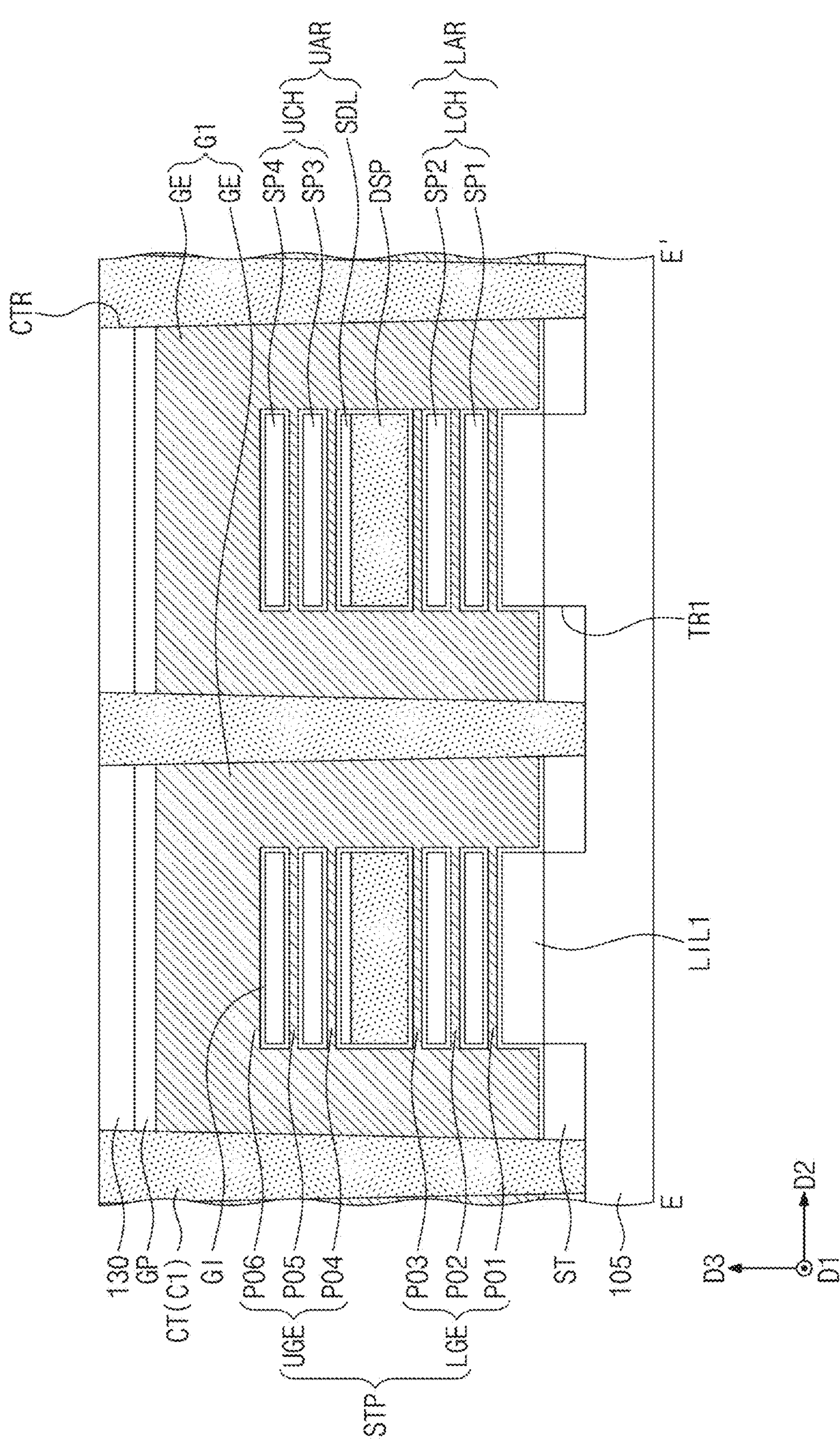
Figure 14C:
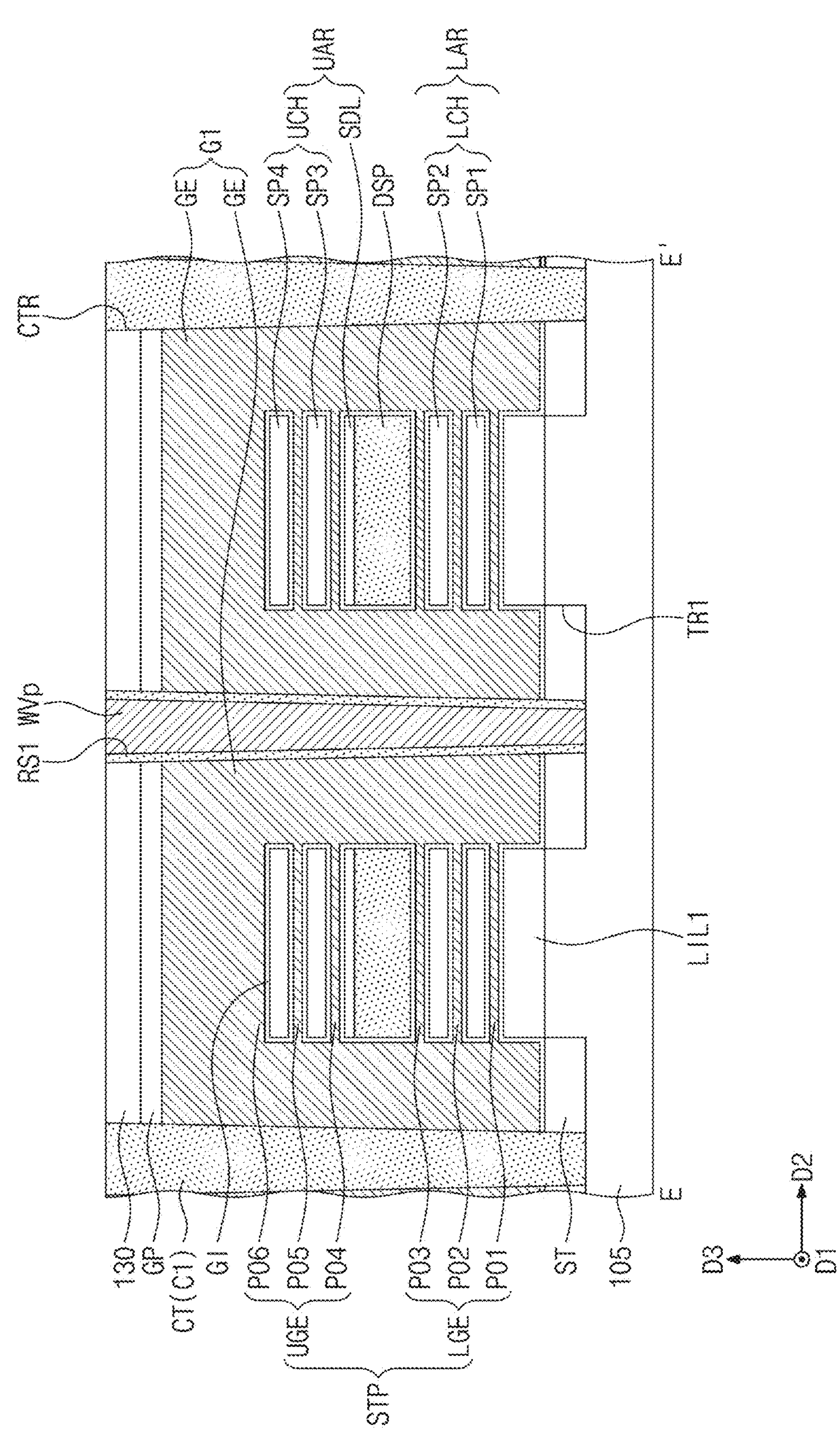
Figure 15D:
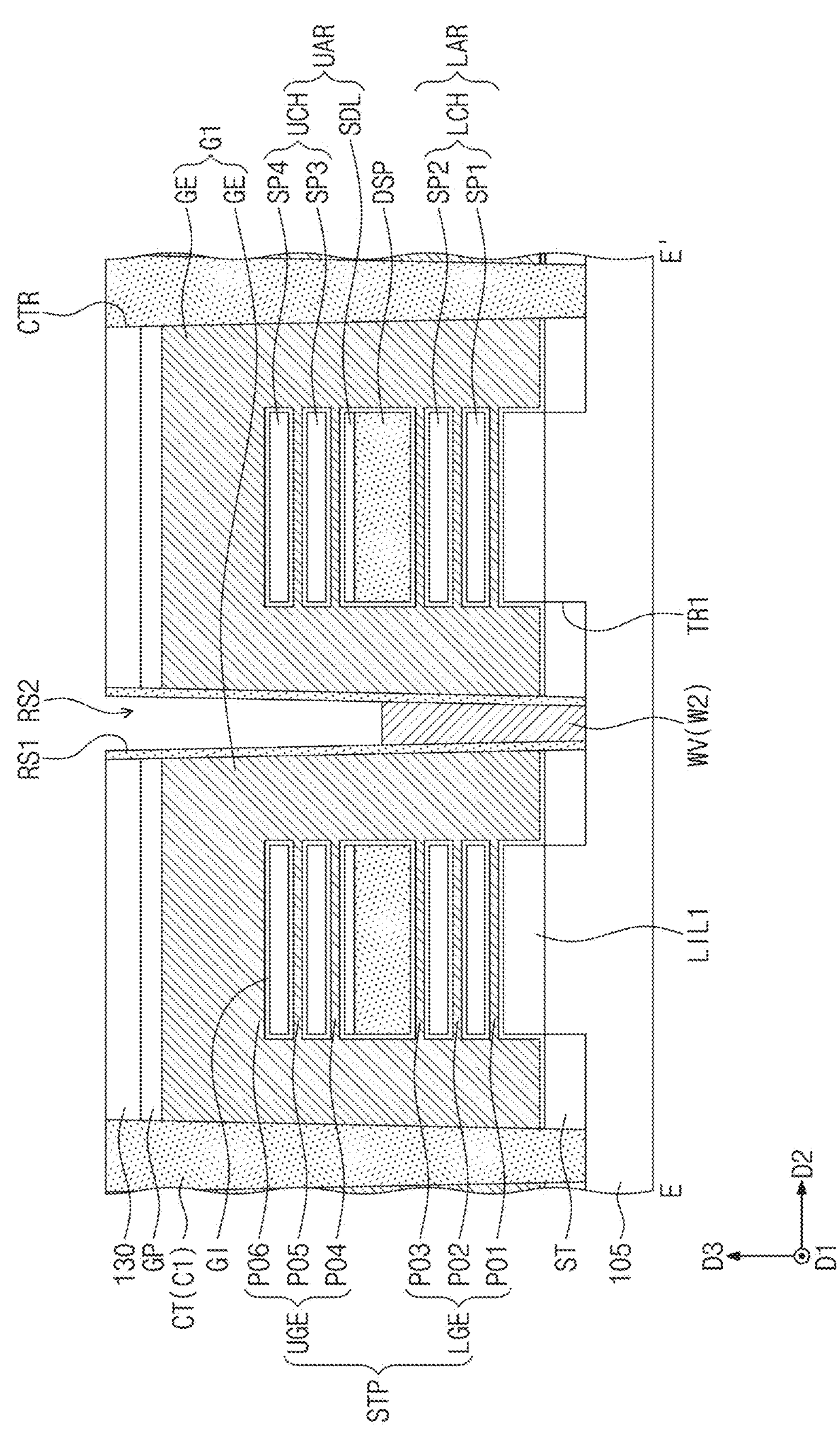

Referring to FIGS. 10A to 10C, a semiconductor substrate 105 may be provided. The semiconductor substrate 105 may be formed of or include at least one of silicon (Si), germanium (Ge), or silicon-germanium (SiGe). For example, the semiconductor substrate 105 may be a single crystalline silicon wafer. In some example embodiments, the substrate 105 may be doped; however, example embodiments are not limited thereto.

A first lower insulating layer LIL1 may be formed on the semiconductor substrate 105. The first lower insulating layer LIL1 may be formed of or include at least one of silicon-based insulating materials (e.g., silicon oxide) and/or semiconductor materials (e.g., Si or SiGe).

First sacrificial layers SAL1 and first active layers ACL1 may be alternatively formed on the first lower insulating layer LIL1, e.g., with an atomic layer deposition (ALD) process. The first sacrificial layers SAL1 and the first active layers ACL1 may be formed of or include at least one of silicon (Si), germanium (Ge), or silicon germanium (SiGe) and may be formed of different materials from each other. For example, the first sacrificial layers SAL1 may be formed of or include silicon germanium (SiGe), and the first active layers ACL1 may be formed of or include silicon (Si). A concentration of germanium (Ge) in each of the first sacrificial layers SAL1 may range from 10 at % to 30 at %, and may or may not be the same as each other. A thickness of each of the first sacrificial layers SAL1 may be the same as each other, or at least one may be different from others. A thickness of each of the first active layers ACL1 may be the same as each other and may be the same as that of the first sacrificial layers SAL1, or at least one may be different from others.

A separation layer DSL may be formed on the uppermost one of the first sacrificial layers SAL1. In various example embodiments, a thickness of the separation layer DSL may be larger than a thickness of the first sacrificial layer SAL1. The separation layer DSL may be formed of or include silicon (Si) or silicon germanium (SiGe). In the case where the separation layer DSL includes silicon germanium (SiGe), a germanium concentration of the separation layer DSL may be higher than a germanium concentration of the first sacrificial layer SAL1. For example, the germanium concentration of the separation layer DSL may range from 40 at % to 90 at %.

The seed layer SDL may be formed on the separation layer DSL. The seed layer SDL may be formed of or include the same the material as the first active layer ACL1. Second sacrificial layers SAL2 and second active layers ACL2 may be alternatively stacked on the seed layer SDL. Each of the second sacrificial layers SAL2 may be formed of or include the same material as the first sacrificial layer SAL1, and each of the second active layers ACL2 may be formed of or include the same material as the first active layer ACL1. The separation layer DSL may be interposed between the first sacrificial layer SAL1 and the seed layer SDL. A thickness of each of the second sacrificial layers SAL2 may be the same as each other, or at least one may be different from others. A thickness of each of the second active layers ACL2 may be the same as each other and may be the same as that of the second sacrificial layers SAL2, or at least one may be different from others.

A stacking pattern STP may be formed by patterning the first and second sacrificial layers SAL1 and SAL2, the first and second active layers ACL1 and ACL2, and the separation layer DSL which are stacked. The formation of the stacking pattern STP may include forming a hard mask pattern on the uppermost one of the second active layers ACL2, and etching the layers SAL1, SAL2, ACL1, ACL2, SDL, and DSL, which are stacked on the semiconductor substrate 105, using the hard mask pattern as an etch mask. During the formation of the stacking pattern STP, an upper portion of the semiconductor substrate 105 may be patterned to form a first trench TR1 defining the single height cell SHC. The stacking pattern STP may be a bar- or line-shaped pattern that is extended in the first direction D1.

The stacking pattern STP may include a lower stacking pattern STP1 on the first lower insulating layer LIL1, an upper stacking pattern STP2 on the lower stacking pattern STP1, and the separation layer DSL between the lower and upper stacking patterns STP1 and STP2. The lower stacking pattern STP1 may include the first sacrificial layers SAL1 and the first active layers ACL1 which are alternately stacked. The upper stacking pattern STP2 may include the seed layer SDL and the second sacrificial and active layers SAL2 and ACL2, which are alternatingly stacked on the seed layer SDL. The device isolation layer ST may be formed on the semiconductor substrate 105 to fill the first trench TR1.

Referring to FIGS. 11A to 11D, a plurality of sacrificial patterns PP may be formed to cross the stacking pattern STP. Each of the sacrificial patterns PP may be formed to have a line shape extended in the second direction D2. In detail, the formation of the sacrificial pattern PP may include forming a sacrificial layer on the semiconductor substrate 105, forming a hard mask pattern MP on the sacrificial layer, and patterning the sacrificial layer using the hard mask pattern MP as an etch mask. The sacrificial layer may be formed of or include amorphous silicon and/or polysilicon such as doped and/or undoped polysilicon.

A pair of the gate spacers GS may be formed on opposite side surfaces of the sacrificial pattern PP, respectively. In detail, a spacer layer may be conformally formed on the semiconductor substrate 105. The spacer layer may cover the sacrificial pattern PP and the hard mask pattern MP. For example, the spacer layer may be formed of or include at least one of SiCN, SiCON, or SiN. The gate spacers GS may be formed by anisotropically etching the spacer layer.

An etching process may be performed on the stacking pattern STP using the gate spacers GS and the hard mask pattern MP as an etch mask. As a result of the etching process, a second trench TR2 may be formed between adjacent ones of the sacrificial patterns PP. Due to the second trench TR2, the stacking pattern STP may be formed to have the shape of the stick.

Sacrificial contact patterns PLH may be formed in the semiconductor substrate 105 exposed through the second trench TR2. The sacrificial contact patterns PLH may be formed in the form of a contact plug. The sacrificial contact patterns PLH may be arranged in the first direction D1. The sacrificial contact patterns PLH may be formed of or include a material (e.g., silicon-germanium (SiGe)) having an etch selectivity with respect to the semiconductor substrate 105. The sacrificial contact patterns PLH may be formed by an epitaxial growth process. The second trench TR2 may be formed to expose the sacrificial contact pattern PLH. That is, the second trench TR2 may overlap with the sacrificial contact pattern PLH.

In the case where the separation layer DSL includes silicon germanium (SiGe), the separation layer DSL may be replaced with a silicon-based insulating material. For example, the separation layer DSL, which is exposed through the second trench TR2, may be selectively removed to form an empty region, and then, a silicon-based insulating material (e.g., silicon nitride) may be formed to fill the empty region.

Referring to FIGS. 12A to 12D, the lower source/drain pattern LSD may be formed in the second trench TR2. In detail, the lower source/drain pattern LSD may be formed by performing a first SEG process using a side surface of the lower stacking pattern STP1, which is exposed through the second trench TR2, as a seed layer. The lower source/drain pattern LSD may be grown using the first active layers ACL1, which are exposed through the second trench TR2, as a seed layer. As an example, the first SEG process may include a chemical vapor deposition (CVD) process or a molecular beam epitaxy (MBE) process.

As an example, impurities may be injected into or incorporated into the lower source/drain pattern LSD in an in-situ manner during the first SEG process. Alternatively or additionally, impurities may be injected into or implanted into the lower source/drain pattern LSD, after the formation of the lower source/drain pattern LSD. The lower source/drain pattern LSD may be doped to have a first conductivity type.

The first active layers ACL1, which are interposed between the paired lower source/drain patterns LSD, may constitute the lower channel pattern LCH. For example, the first and second semiconductor patterns SP1 and SP2 of the lower channel pattern LCH may be formed from the first active layers ACL1. The lower channel patterns LCH and the lower source/drain patterns LSD may constitute the lower active region LAR serving as the bottom tier of the three-dimensional device.

The lower source/drain pattern LSD may be formed to fully fill a space between a pair of the lower channel patterns LCH. For example, the first SEG process may be performed for a sufficient time until the lower source/drain pattern LSD is grown to fill a space between the paired lower channel patterns LCH and connect the paired lower channel patterns LCH to each other.

The first interlayer insulating layer 110 may be formed to cover the lower source/drain pattern LSD. In various example embodiments, an etch stop layer may be additionally formed to conformally cover the lower source/drain pattern LSD, before the formation of the first interlayer insulating layer 110. In various example embodiments, a portion of the first interlayer insulating layer 110 may be formed below the lower source/drain pattern LSD before the formation of the lower source/drain pattern LSD, and another portion of the first interlayer insulating layer 110 may be further formed after the formation of the lower source/drain pattern LSD.

In the second trench TR2, the first interlayer insulating layer 110 may cover a side surface of the upper stacking pattern STP2. Next, an upper portion of the first interlayer insulating layer 110 may be removed to expose the side surface of the upper stacking pattern STP2 in the second trench TR2 again. The upper source/drain pattern USD may be formed on the exposed side surface of the upper stacking pattern STP2. In detail, the upper source/drain pattern USD may be formed by a second SEG process, in which the side surface of the upper stacking pattern STP2 exposed by the second trench TR2 is used as a seed layer. The upper source/drain pattern USD may be grown using the second active layers ACL2, which is exposed by the second trench TR2, as a seed layer. The upper source/drain pattern USD may be doped to have a second conductivity type that is different from the first conductivity type.

The second active layers ACL2, which are interposed between a pair of upper source/drain patterns USD, may serve as the upper channel pattern UCH. For example, the third and fourth semiconductor patterns SP3 and SP4 of the upper channel pattern UCH may be formed from the second active layers ACL2. The upper channel patterns UCH and the upper source/drain patterns USD may constitute the upper active region UAR, which is a top tier of the three-dimensional device. The second SEG process may also be performed for a sufficient time, such that a space between the pair of upper channel patterns UCH is fully filled with the upper source/drain pattern USD.

The second interlayer insulating layer 120 may be formed to cover the upper source/drain pattern USD. In various example embodiments, an etch stop layer may be further formed to conformally cover the upper source/drain pattern USD, before the formation of the second interlayer insulating layer 120.

Thereafter, the second interlayer insulating layer 120 may be planarized to expose a top surface of the sacrificial pattern PP. The planarization of the second interlayer insulating layer 120 may be performed using an etch-back process or a chemical mechanical polishing (CMP) process. All of the hard mask pattern MP on the sacrificial pattern PP may be removed during the planarization process. As a result, the top surface of the second interlayer insulating layer 120 may be coplanar with the top surface of the sacrificial pattern PP and the top surfaces of the gate spacers GS.

Referring to FIGS. 13A to 13D, the exposed sacrificial pattern PP may be selectively removed. The removal of the sacrificial pattern PP may include a wet etching process using etching solution capable of selectively etching polysilicon. As a result of the removal of the sacrificial pattern PP, the first and second sacrificial layers SAL1 and SAL2 may be exposed.

An etching process, which is chosen to selectively etch the first and second sacrificial layers SAL1 and SAL2, may be performed to leave the first to fourth semiconductor patterns SP1 to SP4 and the dummy channel pattern DSP and to remove only the first and second sacrificial layers SAL1 and SAL2. The etching process may be chosen to have a high etch rate to silicon germanium. For example, the etching process may be chosen to have a high etch rate to a silicon germanium layer whose germanium concentration is higher than 10 at %.

The gate insulating layer GI may be conformally formed in an empty space, which is formed by removing the sacrificial pattern PP and the first and second sacrificial layers SAL1 and SAL2. The gate electrode GE may be formed on the gate insulating layer GI. The gate electrode GE may include the first to fifth inner electrodes PO1 to PO5 between the first to fourth semiconductor patterns SP1 to SP4 and the outer electrode PO6 in the empty space, which is formed by removing the sacrificial pattern PP.

The formation of the gate electrode GE may include filling the empty space, which is formed by removing the sacrificial pattern PP and the first and second sacrificial layers SAL1 and SAL2, with a gate electrode line, forming a recess in an upper portion of the gate electrode line, forming a gate capping line in the recess, forming the third interlayer insulating layer 130 to cover the gate electrode line and the second interlayer insulating layer 120, and forming a cutting trench CTR to cross the gate electrode line in the first direction D1. The gate electrode line may be divided into a plurality of gate electrodes GE by the cutting trench CTR, and the gate capping line may be divided into a plurality of gate capping patterns GP by the cutting trench CTR. The cutting trench CTR may be formed to have a line shape extending in the first direction D1.

The first cutting portion C1 of the cutting pattern CT may be formed in the cutting trench CTR. The first cutting portion C1 may fill the cutting trench CTR. The first cutting portion C1 may be formed to cross a region between the gate electrodes GE in the first direction D1.

Referring to FIGS. 14A to 14D, a preliminary wide via WV*p* may be formed in the first cutting portion C1 of the cutting pattern CT. The preliminary wide via WV*p* may be provided to penetrate the first cutting portion C1 of the cutting pattern CT in a vertical direction (e.g., the third direction D3). The formation of the preliminary wide via WV*p* may include forming a first recess RS1 in the first cutting portion C1 of the cutting pattern CT and filling the first recess RS1 with the preliminary wide via WV*p*. In various example embodiments, the penetration via THV may be formed together with the preliminary wide via WV*p*.

The preliminary wide via WV*p* may have a flat top surface. In various example embodiments, the top surface of the preliminary wide via WV*p* and a top surface of the first cutting portion C1 may be located at substantially the same level and may be coplanar with each other. The preliminary wide via WV*p* may be formed to fully fill the first recess RS1.

Referring to FIGS. 15A to 15D, the wide via WV may be formed by removing a portion of the preliminary wide via WV*p*. An empty region, which is formed by removing the portion of the preliminary wide via WV*p*, may be defined as a second recess RS2. The first and second via portions W1 and W2 of the wide via WV may be defined by the second recess RS2. The second via portion W2 may be a portion of the wide via WV, which is vertically overlapped with the second recess RS2, and the first via portion W1 may be another portion of the wide via WV excluding the second via portion W2. The second recess RS2 may be formed in the first recess RS1 and may be defined by the wide via WV and the first cutting portion C1 of the cutting pattern CT.

In various example embodiments, a height HT2 of the second via portion W2 may range from 20% to 80% of the height HT1 of the first via portion W1. Since the height HT2 of the second via portion W2 is greater than or equal to 20% of the height HT1 of the first via portion W1, the process may be facilitated, compared to the case where the second recess RS2 is deeply formed. Since the height HT2 of the second via portion W2 is less than or equal to 80% of the height HT1 of the first via portion W1, and thus, it may be possible to effectively prevent a short circuit between the second upper active contact UAC2 and the wide via WV.

As described with reference to FIGS. 3 to 9B, the first and second via portions W1 and W2 of the wide via WV may be formed to have various structures, depending on positions of the first and second recesses RS1 and RS2. However, the structure of the first and second via portions W1 and W2 of the wide via WV is not limited to this example.

Referring back to FIGS. 3 to 5E, the second cutting portion C2 of the cutting pattern CT may be formed in the second recess RS2. The second cutting portion C2 may be formed on the second via portion W2 of the wide via WV and may cover the second via portion W2. The second cutting portion C2 may be vertically overlapped with the second via portion W2.

The upper active contacts UAC may be formed to penetrate the second and third interlayer insulating layers 120 and 130 and may be coupled to the upper source/drain patterns USD, respectively. In various example embodiments, the first upper active contact UAC1 may be formed to be electrically connected to the first upper source/drain pattern USD1 and the wide via WV. The upper gate contact UGC may be formed to penetrate the second and third interlayer insulating layers 120 and 130 and may be coupled to the gate electrode GE.

The fourth interlayer insulating layer 140 may be formed on the third interlayer insulating layer 130. The first metal layer M1 including the upper interconnection lines UMI may be formed in the fourth interlayer insulating layer 140. The upper vias UVI may be formed to electrically connect the first metal layer M1 to the gate contacts GC and the upper active contacts UAC. A BEOL layer including additional metal layers (e.g., M2, M3, M4, and so forth) may be formed on the first metal layer M1.

Thereafter, the semiconductor substrate 105 may be inverted such that a rear surface of the semiconductor substrate 105 is exposed to the outside. The exposed semiconductor substrate 105 may be selectively removed. Accordingly, the sacrificial contact patterns PLH and the first lower insulating layer LIL1 may be exposed.

The second lower insulating layer LIL2 may be formed on the exposed sacrificial contact patterns PLH and the exposed first lower insulating layer LIL1. For example, the second lower insulating layer LIL2 may be formed of or include at least one of silicon-based insulating materials (e.g., silicon oxide, silicon oxynitride, or silicon nitride). In various example embodiments, the second lower insulating layer LIL2 may be formed of or include the same material as the device isolation layer ST. The first and second lower insulating layers LIL1 and LIL2 may constitute the substrate 100. A planarization process may be performed on the substrate 100 to expose the sacrificial contact patterns PLH.

The sacrificial contact pattern PLH may be replaced with the lower active contact LAC. In detail, the sacrificial contact pattern PLH may be selectively removed. An etching process may be further performed on a region, which is formed by removing the sacrificial contact pattern PLH, to expose the lower source/drain pattern LSD. The lower active contact LAC may be formed to be coupled to the exposed lower source/drain pattern LSD. The lower active contact LAC may be formed through a self-aligned process using the sacrificial contact pattern PLH. The lower gate contact LGC may be formed to penetrate the substrate 100 and may be coupled to the gate electrode GE.

The back-side metal layer BSM may be formed on the lower active contact LAC. The back-side metal layer BSM may include the lower contact LC, the lower interconnection line LMI, and the lower via LVI. In various example embodiments, the second lower active contact LAC2 may be formed to be electrically connected to the second lower source/drain pattern LSD2 and the wide via WV. Additional back-side metal layers may be formed on the back-side metal layer BSM. In various example embodiments, the additional back-side metal layers may include a power delivery network layer.

A top surface of a wide via may be partially recessed to increase a distance from the wide via to an upper active contact, which should be disconnected from the wide via. Accordingly, it may be possible to prevent a short circuit from being formed between the wide via and the upper active contact and thereby to improve electrical and/or reliability characteristics of a three-dimensional semiconductor device.

Alternatively or additionally, the wide via may be used to electrically connect lower and upper source/drain patterns, which are horizontally spaced apart from each other, and this may make it possible to increase a degree of freedom in designing a three-dimensional semiconductor device.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Moreover, when the words "generally" and "substantially" are used in connection with material composition, it is intended that exactitude of the material is not required but that latitude for the material is within the scope of the disclosure.

Further, regardless of whether numerical values or shapes are modified as "about" or "substantially," it will be understood that these values and shapes should be construed as including a manufacturing or operational tolerance (e.g., ±10%) around the stated numerical values or shapes. Thus, while the term "same," "identical," or "equal" is used in description of example embodiments, it should be understood that some imprecisions may exist. Thus, when one element or one numerical value is referred to as being the same as another element or equal to another numerical value, it should be understood that an element or a numerical value is the same as another element or another numerical value within a desired manufacturing or operational tolerance range (e.g., ±10%).

While various example embodiments of inventive concepts have been particularly shown and described, it will be understood by one of ordinary skill in the art that variations in form and detail may be made therein without departing from the spirit and scope of the attached claims. Additionally, example embodiments are not necessarily mutually exclusive with one another. For example, some example embodiments may include one or more features described with reference to one or more figures, and may also include one or more other features described with reference to one or more other figures.

What is claimed is:

1. A three-dimensional (3D) semiconductor device, comprising:
- a back-side metal layer;
- a lower channel pattern on the back-side metal layer;
- a first lower source/drain pattern and a second lower source/drain pattern spaced apart from each other in a first direction with the lower channel pattern interposed therebetween, the first lower source/drain pattern connected to the lower channel pattern;
- an upper channel pattern on the lower channel pattern;
- a first upper source/drain pattern on the first lower source/drain pattern, the first upper source/drain pattern connected to the upper channel pattern;
- a second upper source/drain pattern on the second lower source/drain pattern; and
- a wide via electrically connecting the first upper source/drain pattern to the second lower source/drain pattern,
- wherein the wide via comprises a first via portion having a first top surface and a second via portion having a second top surface at a level lower than the first top surface.

2. The 3D semiconductor device of claim 1, wherein the wide via has an 'L'-shaped profile, when viewed in a sectional view.

3. The 3D semiconductor device of claim 1, wherein
- the first via portion has a first bottom surface,
- the second via portion has a second bottom surface, and
- the first bottom surface and the second bottom surface are at a same level.

4. The 3D semiconductor device of claim 1, wherein
- the first via portion has a first sub-side surface that is oriented in the first direction,
- the second via portion has a second sub-side surface that is oriented in the first direction, and
- the second sub-side surface is offset from the first sub-side surface in the first direction.

5. The 3D semiconductor device of claim 1, wherein the first via portion and the second via portion are arranged in the first direction.

6. The 3D semiconductor device of claim 1, wherein a height of the second via portion ranges from 20% to 80% of a height of the first via portion, when measured in a vertical direction.

7. The 3D semiconductor device of claim 1, further comprising:
- a first upper active contact electrically connecting the first upper source/drain pattern to the wide via; and
- a second upper active contact electrically connected to the second upper source/drain pattern and electrically disconnected from the wide via,
- wherein the second top surface is at a level lower than a top surface of the second upper active contact.

8. The 3D semiconductor device of claim 7, wherein the second upper active contact is horizontally spaced apart from the wide via, when viewed in a plan view.

9. The 3D semiconductor device of claim 1, further comprising:
- a gate electrode between the first upper source/drain pattern and the second upper source/drain pattern,
- wherein the wide via is spaced apart from the gate electrode in a second direction crossing the first direction.

10. The 3D semiconductor device of claim 9, wherein a width of the wide via is larger than a width of the gate electrode, when measured in the first direction.

11. The 3D semiconductor device of claim 9, wherein the gate electrode comprises a plurality of gate electrodes spaced apart from each other in the first direction between the first upper source/drain pattern and the second upper source/drain pattern.

12. The 3D semiconductor device of claim 1, further comprising:

a third upper source/drain pattern spaced apart from the second upper source/drain pattern in a second direction crossing the first direction; and a third upper active contact electrically connected to the third upper source/drain pattern and electrically disconnected from the wide via, wherein the third upper active contact is horizontally spaced apart from the wide via, when viewed in a plan view.

13. The 3D semiconductor device of claim 1, further comprising:

a fourth upper source/drain pattern between the first upper source/drain pattern and the second upper source/drain pattern.

14. The 3D semiconductor device of claim 1, further comprising:

a cutting pattern enclosing the wide via, wherein the cutting pattern covers the second top surface of the second via portion.

15. A three-dimensional (3D) semiconductor device, comprising:

a back-side metal layer;

a lower channel pattern on the back-side metal layer;

a first lower source/drain pattern and a second lower source/drain pattern spaced apart from each other in a first direction with the lower channel pattern interposed therebetween, the first lower source/drain pattern connected to the lower channel pattern;

an upper channel pattern on the lower channel pattern;

a first upper source/drain pattern on the first lower source/drain pattern, the first upper source/drain pattern connected to the upper channel pattern;

a second upper source/drain pattern on the second lower source/drain pattern; and a wide via electrically connecting the first upper source/drain pattern to the second lower source/drain pattern, wherein a lower portion of the wide via protrudes in the first direction, compared to an upper portion of the wide via.

16. The 3D semiconductor device of claim 15, wherein a side surface of the wide via s discontinuously extends in a vertical direction, and another side surface of the wide via continuously extends in the vertical direction.

17. The 3D semiconductor device of claim 15, wherein the upper portion of the wide via has a first sub-side surface oriented in the first direction, the lower portion of the wide via has a second sub-side surface oriented in the first direction, and the second sub-side surface is offset from the first sub-side surface in the first direction.

18. The 3D semiconductor device of claim 15, wherein a width of the lower portion of the wide via is larger than a width of the upper portion, when measured in the first direction.

19. The 3D semiconductor device of claim 15, further comprising:

a first upper active contact electrically connecting the first upper source/drain pattern to the wide via; and a second upper active contact electrically connected to the second upper source/drain pattern and electrically disconnected from the wide via, wherein a top surface of the lower portion of the wide via is at a level lower than a top surface of the second upper active contact.

20. The 3D semiconductor device of claim 15, further comprising:

one or more gate electrodes between the first upper source/drain pattern and the second upper source/drain pattern.

* * * * *